(12) United States Patent
Kim

(10) Patent No.: US 8,324,688 B2
(45) Date of Patent: Dec. 4, 2012

(54) ELECTROSTATIC DISCHARGE PROTECTION DEVICE FOR HIGH VOLTAGE OPERATION

(75) Inventor: Kilho Kim, Icheon-si (KR)

(73) Assignee: Bauabtech (KR)

( * ) Notice: Subject to any disclaimer, the term of this patent is extended or adjusted under 35 U.S.C. 154(b) by 218 days.

(21) Appl. No.: 12/952,224

(22) Filed: Nov. 23, 2010

(65) Prior Publication Data

US 2011/0121395 A1 May 26, 2011

(30) Foreign Application Priority Data

Nov. 25, 2009 (KR) .......................... 10-2009-0114754

(51) Int. Cl.
*H01L 23/62* (2006.01)
(52) U.S. Cl. ................... 257/361; 257/E23.002
(58) Field of Classification Search ................... 257/361, 257/E23.002
See application file for complete search history.

(56) References Cited

U.S. PATENT DOCUMENTS

| 7,554,160 B2 * | 6/2009 | Nakamura | 257/361 |
| 7,582,936 B2 * | 9/2009 | Kim | 257/355 |
| 7,910,951 B2 * | 3/2011 | Vashchenko | 257/175 |
| 2008/0237783 A1 * | 10/2008 | Williams et al. | 257/513 |

\* cited by examiner

*Primary Examiner* — Phuc Dang
(74) *Attorney, Agent, or Firm* — Schmeiser, Olsen & Watts, LLP

(57) ABSTRACT

The present disclosure provides ESD protection devices that can effectively cope with electrostatic stress of microchips for high voltage operation. The ESD protection device includes protection device includes: a high voltage P well formed in a semiconductor substrate, an N-drift region formed in the high voltage P well, an anode N+ diffusion region and an anode P+ diffusion region formed in the N-drift region, a buffer N+ diffusion region formed in the N-drift region and separated a predetermined distant from the anode N+ diffusion region, a buffer N-ballistic region surrounding the buffer N+ diffusion region, an anode N-ballistic region surrounding the anode N+ diffusion region and the anode P+ diffusion region, a cathode N+ diffusion region and a cathode P+ diffusion region formed in the high voltage P well and separated a predetermined distance from the N-drift region, a MOSFET gate disposed on the semiconductor substrate between the cathode N+ diffusion region and the N-drift region, and a capacitor electrode disposed on the semiconductor substrate between the anode N+ diffusion region and the buffer N+ diffusion region.

16 Claims, 22 Drawing Sheets

ELECTROSTATIC DISCHARGE PROTECTION DEVICE FOR HIGH VOLTAGE OPERATION

FIELD OF THE TECHNOLOGY

The present disclosure relates to semiconductor devices and, more particularly, to an improved electrostatic discharge protection device for high voltage operation.

DESCRIPTION

In general, semiconductor devices include an electrostatic discharge (ESD) protection circuit between a pad and a core circuit to protect the core circuit. The electrostatic discharge protection circuit prevents chip failure that is likely to occur when static electricity caused by contact between an external pin of a microchip and a charged human body or machine is discharged to a core circuit or when accumulated static electricity flows to the core circuit. In fabrication of microchips, it is an essential aspect of chip design to design a circuit for protecting a microchip from ESD stress. A device for use in the protection circuit against the ESD stress is referred to as an ESD protection device.

FIG. 1a is a graphical representation depicting fundamental conditions for an electrostatic discharge protection device, and FIG. 1b is a graphical representation depicting an optimal condition for the ESD protection device.

The ESD protection device has to prevent current flow therethrough upon application of voltage less than or equal to an operating voltage Vop to the ESD protection device during normal operation of a microchip adopting the ESD protection device. In order to satisfy this requirement, the avalanche voltage Vav and the triggering voltage Vtr of the ESD protection device must be greater than the operating voltage of the microchip during normal operation of the microchip (Vav, Vtr>Vop).

The ESD protection device must be able to provide sufficient protection to a core circuit in the microchip when the microchip is subjected to electrostatic discharge stress. In other words, when an electrostatic current flows to the microchip, it must be discharged to the outside through the ESD protection device before flowing to the core circuit. To satisfy this requirement, the triggering voltage Vtr of the ESD protection device must be sufficiently lower than the core circuit breakdown voltage Vccb of the microchip under the circumstance that ESD stress is generated in the microchip (Vtr<Vccb).

Generally, an efficient ESD protection device exhibits a resistance snapback characteristic wherein on-state resistance of the ESD protection device is reduced after the device is triggered. Such a resistance snapback characteristic is exhibited as a voltage snapback phenomenon wherein the corresponding voltage is lowered, despite an increase in current flowing through the ESD protection device. Here, if the snapback phenomenon becomes too severe, the ESD protection device suffers a latch-up phenomenon which allows excess current to flow through the ESD protection device, thereby causing thermal breakdown of the microchip, even under the conditions that the microchip is normally operated. The ESD protection device must be prevented from abnormal operation resulting from the latch-up phenomenon. To satisfy this requirement, the snapback holding voltage Vh of the ESD protection device must be greater than the operating voltage of the microchip by a sufficient safety margin (Vh>VoP+$^{\Delta}$V).

Alternatively, the triggering current Itr must be sufficiently greater than a certain value (Itr>~100 mA). The ESD protection device generally adopts a multi-finger structure wherein devices having a constant size are arranged in parallel to each other for efficient use of a layout area. When such a multi-finger structure is adopted, it is necessary for the respective fingers of the ESD protection device to operate uniformly. In other words, the respective fingers of the ESD protection device cooperate to discharge an induced electrostatic discharge current to the outside. To this end, other fingers must also be triggered to cooperatively discharge the ESD current before a certain finger is triggered and suffers thermal breakdown. To satisfy this requirement, the thermal breakdown voltage Vtb of the ESD protection device must be greater than or at least similar to the triggering voltage (Vtr≦Vtb) thereof.

For normal operation of a microchip, these four conditions must be satisfied. Further, when an ESD current flows to the microchip, it is necessary for the ESD protection device to start to operate as rapidly as possible at as low a voltage as possible.

In addition, an important way to increase price competitiveness of microchips is in decreasing the size of the microchips, which requires an ESD protection device having a small size and capable of discharging a large amount of ESD current.

On the other hand, one fundamental characteristic for semiconductor devices operating at high voltage is that the avalanche voltage must be higher than the operating voltage. To satisfy this requirement, the semiconductor device employs, as a basic element, an N-type MOSFET having a double diffused drain, that is, a double diffused drain N-type MOSFET (DDDNMOS), as shown in FIG. 2.

In order to construct the DDDNMOS structure, double impurity implantation for forming a drain is performed as shown in FIG. 2. In the DDDNMOS structure, a drain activation area 121 is formed by implanting an impurity at a sufficiently high density of $10^{15}$~~$10^{16}$ cm$^{-3}$, and a drain drift area 120 is formed outside the drain activation area 121 by implanting an impurity at a relatively low density of about $10^{13}$ cm$^{-3}$. In most cases, a source activation area 130 has the same impurity density as the drain activation area 121 since they are formed at the same time by the impurity implantation. A P-well 110 forming a channel is formed by implanting a P-type impurity at a density of about $10^{12}$ cm$^{-3}$, which is lower than the drain drift area 120. Generally, the avalanche voltage tends to increase as two adjoining areas having electrically opposite polarities decrease in impurity densities. Hence, since the DDDNMOS structure enables sufficient reduction of the impurity density for the drain drift area 120 which adjoins the P-well 101, it is possible to achieve a desired high avalanche voltage. In order to use the DDDNMOS operating at high voltage as the ESD protection device, a gate 150, a source 130 and a well-pick up 140 are bundled and grounded on a circuit, with only the drain 121 connected to a power terminal or an individual input/output terminal, thereby forming a grounded gate DDDNMOS (GGDDDNMOS), as shown in FIG. 2. With this electrode structure, the GGDDDNMOS does not allow an electric current to flow therethrough when a voltage applied to the drain is lower than the avalanche voltage. On the other hand, when the voltage applied to the drain increases above the avalanche voltage, impact ionization occurs at an interface between the P-well and the drain drift area to create a number of carriers, so that a parasitic NPN bipolar transistor is formed, causing a large amount of electric current to flow between the drain and the source. Consequently, the GGDDDNMOS with this electrode structure does not allow an electric current to flow therethrough at a voltage less than the avalanche voltage while allowing the current to flow therethrough at a voltage more than the avalanche voltage, thereby satisfying the fundamental characteristics for use as the ESD protection device which protects a core circuit by coping with undesired stress current during electrostatic discharge. To increase ESD stress current treatment capabilities, a multi-finger GGDDDNMOS is provided by connecting several single-finger GGDDDN-MOS devices in parallel to each other.

Here, when a parasitic NPN bipolar transistor (BJT) is created in the GGDDDNMOS to allow a large amount of current to start to flow therethrough, a very low resistive current path is formed to connect the drain/channel/source areas to each other along the surface of the device, causing current crowding only on the device surface. Such current crowding on the device surface causes deterioration in capability of the GGDDDNMOS to cope with ESD stress current. In particular, since the current path has very low resistance, the thermal breakdown voltage of the GGDDDNMOS becomes lower than the triggering voltage of the BJT, thereby making it difficult to realize stable multi-finger triggering. In this way, when the current path is restrictively formed along the surface of the device to cause the current crowding only on the device surface, a surface temperature of the device sharply rises even at low current, thereby causing the thermal breakdown phenomenon on the surface of the device. As a result, the capability of the device to cope with the ESD stress current is significantly deteriorated.

FIG. 3 is a graphical representation depicting typical voltage-current characteristics of a GGDDDNMOS device operating as an ESD protection device.

In view of a design window of the ESD protection device, the GGDDDNMOS device cannot be used as the ESD protection device due to the following problems.

First, the GGDDDNMOS device is not sufficiently strong against stress current. Specifically, the GGDDDNMOS device cannot cope with a large amount of electrostatic current. Second, since the GGDDDNMOS device exhibits an excessively strong snapback phenomenon, the GGDDDN-MOS device is likely to cause the latch-up phenomenon in normal operation conditions. Third, the thermal breakdown voltage of the GGDDDNMOS device is lower than the triggering voltage of the BJT (Vtr≧Vtb). As a result, the respective fingers of the multi-finger structure do not operate uniformly.

Therefore, since the GGDDDNMOS device for high voltage operation cannot be used as the ESD protection device due to its electrical properties, there is a need for an improved ESD protection device that can solve the aforementioned problems.

SUMMARY

Aspects of the present disclosure provide improved electrostatic discharge protection devices that can effectively cope with electrostatic stress of microchips for high voltage operation.

According to one aspect, an electrostatic discharge (ESD) protection device includes: a high voltage P well formed in a semiconductor substrate; an N-drift region formed in the high voltage P well; an anode N+ diffusion region and an anode P+ diffusion region formed in the N-drift region; a buffer N+ diffusion region formed in the N-drift region and separated a predetermined distant from the anode N+ diffusion region; a buffer N-ballistic region surrounding the buffer N+ diffusion region; an anode N-ballistic region surrounding the anode N+ diffusion region and the anode P+ diffusion region; a cathode N+ diffusion region and a cathode P+ diffusion region formed in the high voltage P well and separated a predetermined distance from the N-drift region; a MOSFET gate disposed on the semiconductor substrate between the cathode N+ diffusion region and the N-drift region; and a capacitor electrode disposed on the semiconductor substrate between the anode N+ diffusion region and the buffer N+ diffusion region.

The ESD protection device may further include a resistor polysilicon layer on the semiconductor layer outside the high voltage P well.

The buffer N-ballistic region may be formed at a density of $10^{13}$~$10^{14}$ ions/cm$^3$ to pass through the N-drift region in a depth direction.

The anode N-ballistic region may be formed at a density of $10^{13}$~$10^{14}$ ions/cm$^3$ to pass through the N-drift region in a depth direction.

The anode N+ diffusion region and the anode P+ diffusion region may be connected together to constitute an anode. Alternatively, only the anode P+ diffusion region may be connected to constitute the anode without directly connecting the anode N+ diffusion region.

The capacitor electrode, the MOSFET gate and the resistor polysilicon layer may be connected at one end thereof to one another, and the other end of the resistor polysilicon layer may be connected to a cathode, such that a DDDNMOS gate formed in an HVOHORGCR may be coupled to the anode through a capacitor and may be coupled to the cathode through a resistor.

The ESD protection device may further include at least one diode connected in series between a terminal to which the cathode N+ diffusion region and the cathode P+ diffusion region are connected and a cathode terminal.

The ESD protection device may further include at least one P-type MOSFET disposed in series between a terminal to which the cathode N+ diffusion region and the cathode P+ diffusion region are connected and a cathode terminal.

According to another aspect, an electrostatic discharge (ESD) protection device includes: an N-drift region formed in a semiconductor substrate; an anode N+ diffusion region and an anode P+ diffusion region formed in the N-drift region; a buffer N+ diffusion region formed in the N-drift region and separated a predetermined distant from the anode N+ diffusion region; a buffer N-ballistic region surrounding the buffer N+ diffusion region; an anode N-ballistic region surrounding the anode N+ diffusion region and the anode P+ diffusion region; a cathode N+ diffusion region and a cathode P+ diffusion region formed in the semiconductor substrate outside the N-drift region and separated a predetermined distance from the N-drift region; a high voltage P well surrounding the cathode N+ diffusion region and the cathode P+ diffusion region with one side of the high voltage P well disposed between the anode N-ballistic region and the buffer N-ballistic region; a MOSFET gate disposed on the semiconductor substrate between the cathode N+ diffusion region and the N-drift region; and a capacitor electrode disposed on the semiconductor substrate between the anode N+ diffusion region and the buffer N+ diffusion region.

BRIEF DESCRIPTION OF THE DRAWINGS

The above and other features and advantages of the present disclosure will become apparent from the following description of exemplary embodiments given in conjunction with the accompanying drawings, in which.

DETAILED DESCRIPTION

Exemplary embodiments will now be described in detail with reference to the accompanying drawings. It should be understood that the embodiments may be modified in various ways and are not intended to limit the scope of the present disclosure.

ESD protection devices having a rectifier structure for high voltage operation have been actively studied and developed as a substitute device for overcoming the problems of the GGDDDNMOS device operating at high voltage.

Figure 4A:
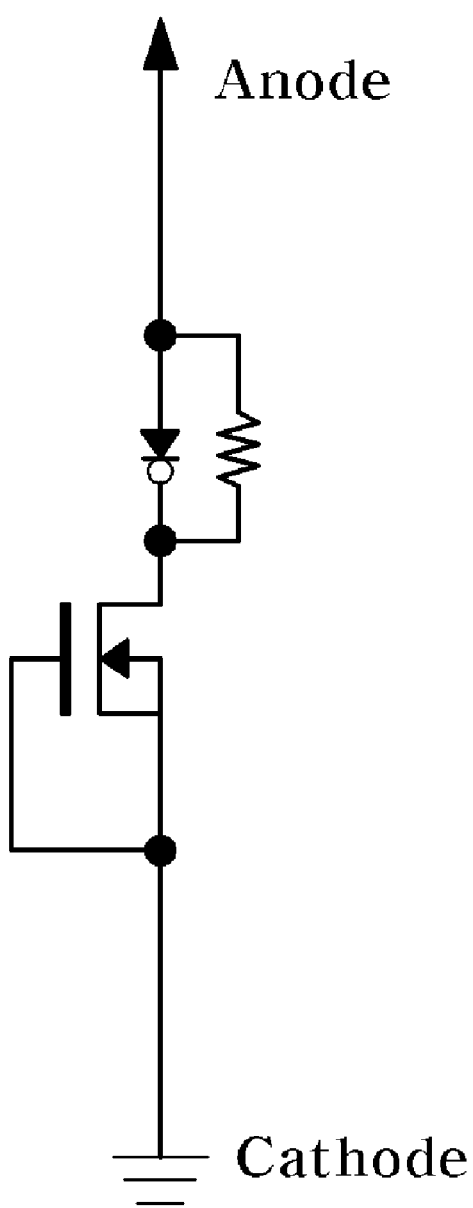
FIGS. 4a and 4b are a circuit diagram and a sectional view of an ESD protection device having a rectifier structure for high voltage operation.
Figure 4B:
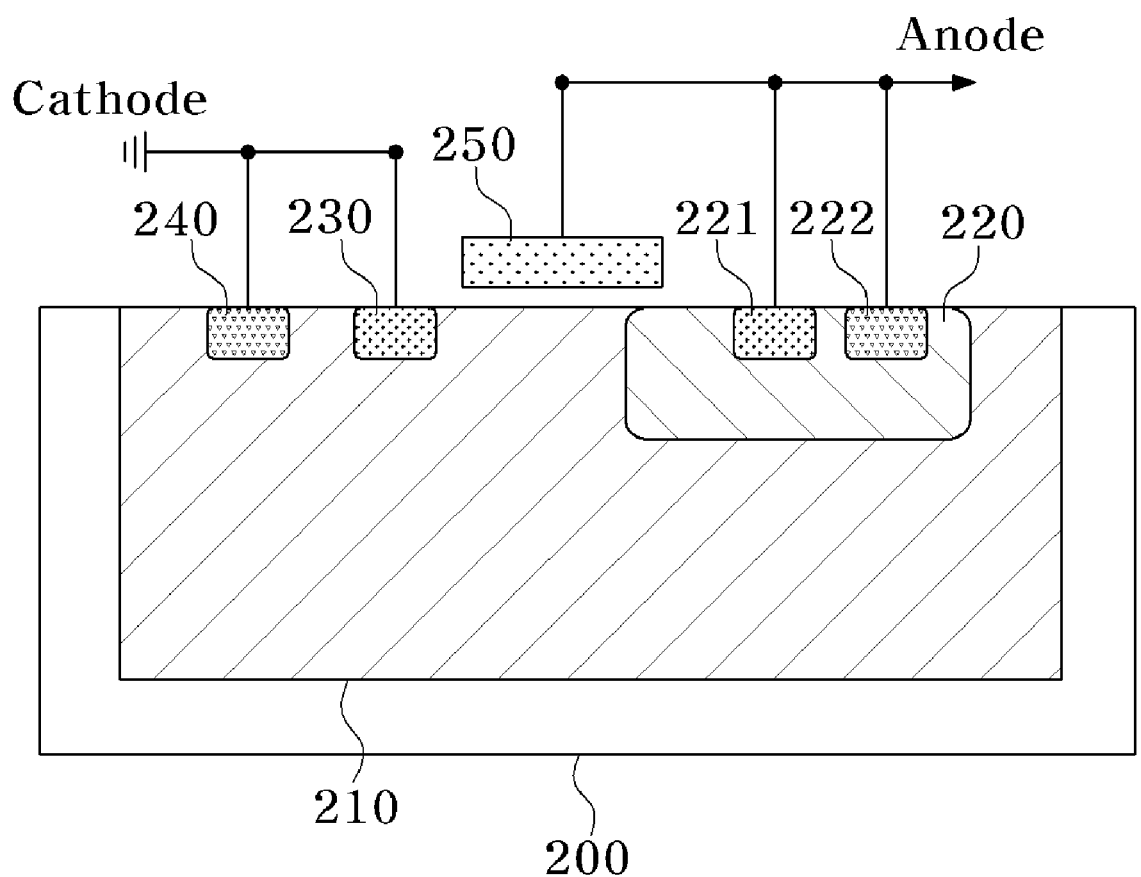

FIGS. 4a and 4b are a circuit diagram and a sectional view of an ESD protection device having a rectifier structure for high voltage operation, respectively.

In the ESD protection device having the rectifier structure for high voltage operation, a P well 210 is formed on a P-type semiconductor substrate 200. Although conditions for forming the high voltage P well 210 through impurity implantation may be changed depending on processes, the high voltage P well 210 is formed at an impurity density of about $10^{12}$ cm$^{-3}$. An anode N-drift region 220 is formed in the high voltage P well 210. The anode N-drift region 220 has an impurity density of about $10^{13}$ cm$^{-3}$. An anode N+ diffusion region 221 and an anode P+ diffusion region 222 are formed in the anode N-drift region 220. A cathode N+ diffusion region 230 and a cathode P+ diffusion region 240 are formed in the high voltage P well 210 outside the anode N-drift region 220. N-type impurities are implanted at a density of about $10^{15}$~$10^{16}$ cm$^{-3}$ to the N+ diffusion region 221 and P-type impurities are implanted at a density of about $10^{15}$~$10^{16}$ cm$^{-3}$ to the P+ diffusion region 222. A gate 250 is formed on the semiconductor substrate 200 between the cathode N+ diffusion region 230 and the anode N-drift region 220. In this case, the cathode N+ diffusion region 230 is disposed adjacent the gate 250 and the anode N-drift region 220 is disposed adjacent the gate 250 or overlaps the gate 250.

The cathode P+ diffusion region 240 and the cathode N+ diffusion region 230 are electrically connected together to constitute a cathode, and the anode N+ diffusion region 221, anode P+ diffusion region 222 and gate 250 are electrically connected together to constitute an anode. The cathode P+ diffusion region 240, cathode N+ diffusion region 230, gate 250, and anode N+ diffusion region 221 in the high voltage P well 210 substantially constitute an N-type MOSFET structure for high voltage operation. Further, a lateral NPN BJT (LNPN BJT) which is constituted by the anode N+ diffusion region 221, anode N-drift region 220, high voltage P well 210 and cathode N+ diffusion region 230, and an MVPNP HBJT structure which is constituted by the cathode P+ diffusion region 240, high voltage P well 210, anode N-drift region 220 and anode P+ diffusion region 222, are formed between the anode and cathode. The LNPN BJT and the VPNP BJT will be coupled to each other, thereby forming a rectifier that enables very efficient current flow.

In the structure described above, when electrostatic current flows between the anode and the cathode by connecting the cathode to a ground and applying a positive voltage to the anode, the LNPN BJT and the VPNP BJT are coupled to each other and operates as a rectifier that enables very efficient current flow. By operation of these devices as a rectifier, an electric current widely spreads by flowing not only on the surface of the rectifier but also in the depth direction of the rectifier, so that the rectifier may discharge a considerably large amount of electrostatic current over the size of the rectifier. Generally, although there is a difference in discharging amount of electrostatic current depending on processes, this rectifier may cope with an electrostatic current of about 30~60 mA/μm per unit size.

Figure 1A:
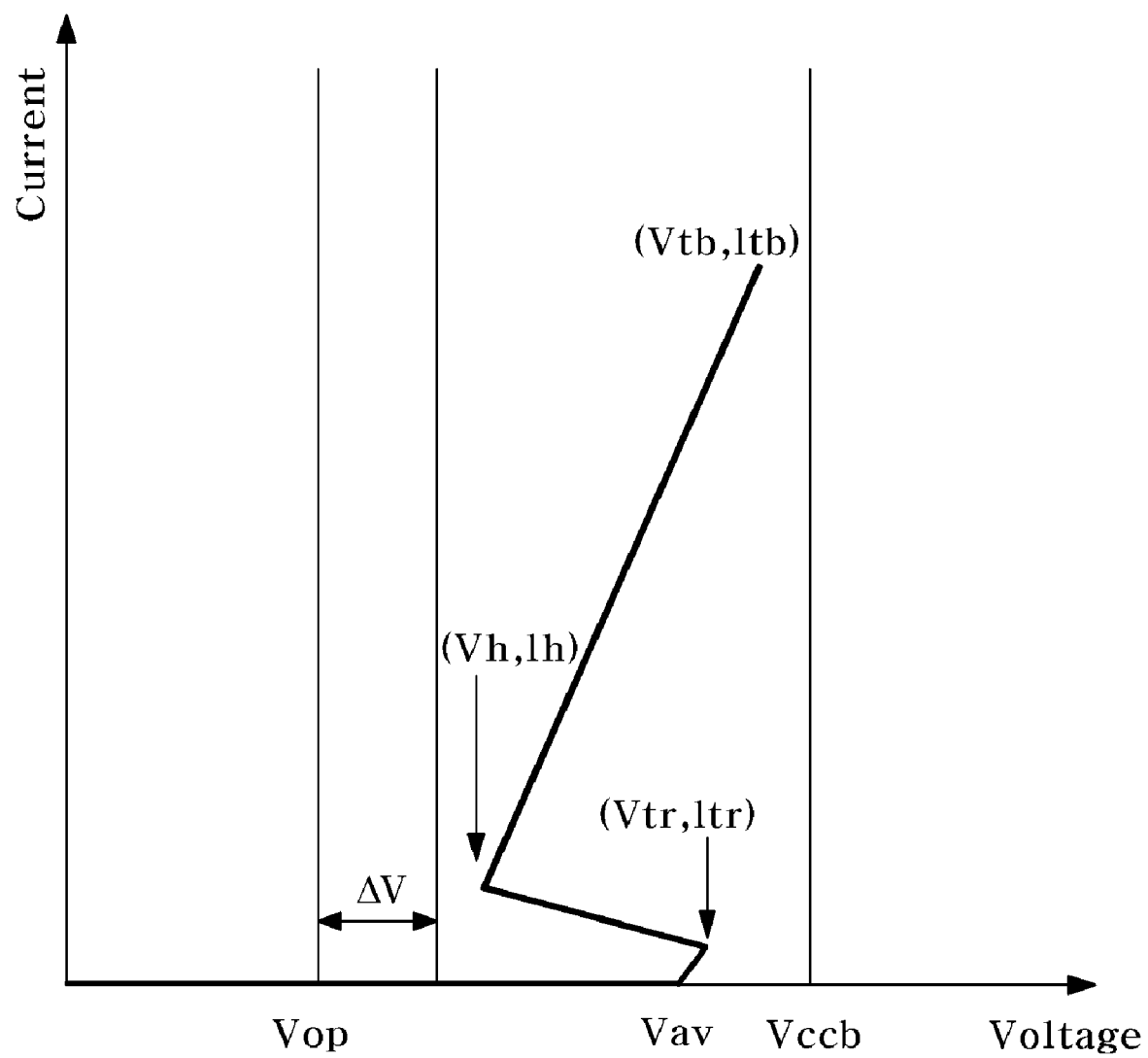
FIG. 1a is a graphical representation depicting fundamental conditions for an electrostatic discharge (ESD) protection device.
Figure 1B:
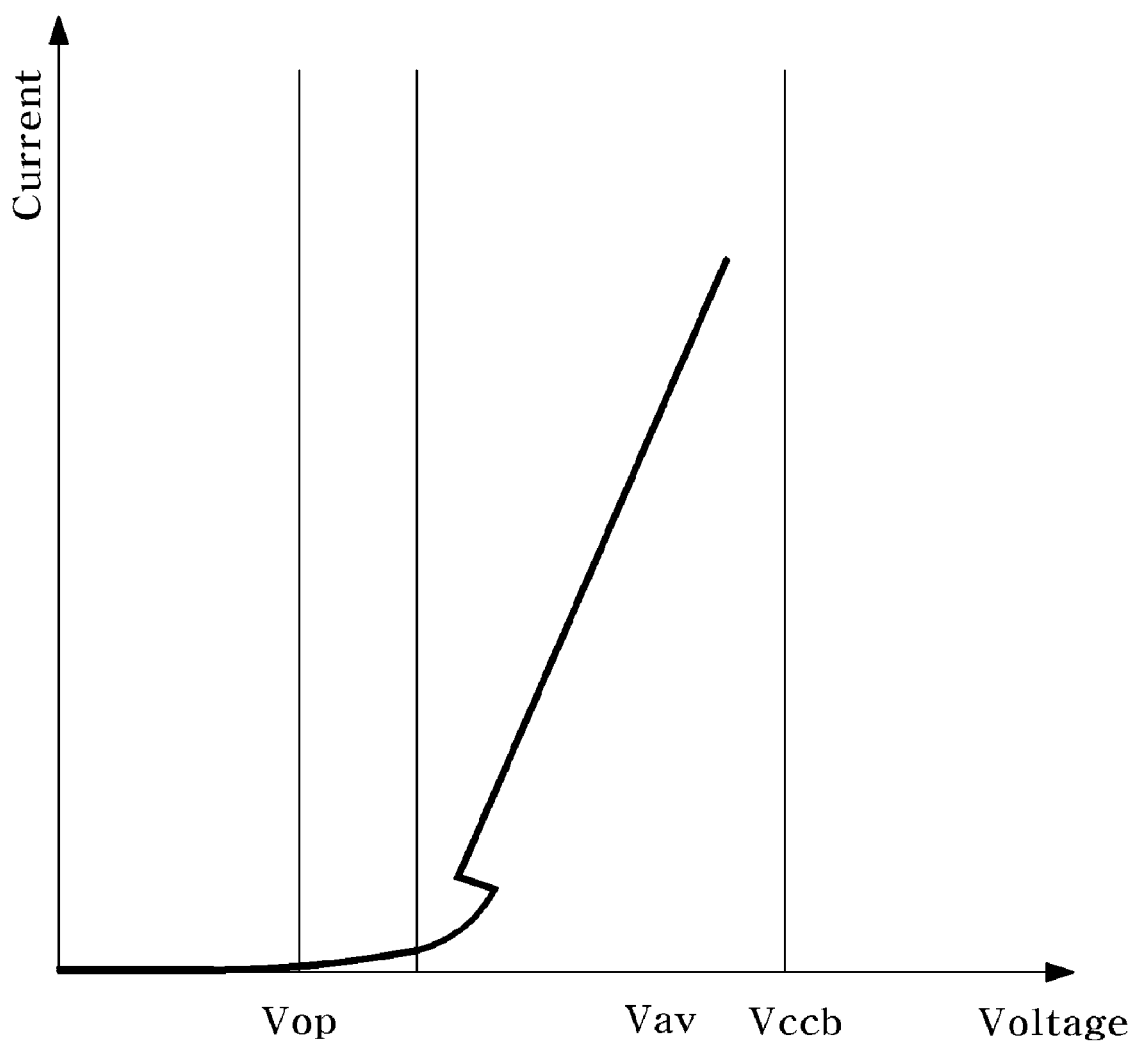
FIG. 1b is a graphical representation depicting an optimal condition for the ESD protection device.
Figure 2A:
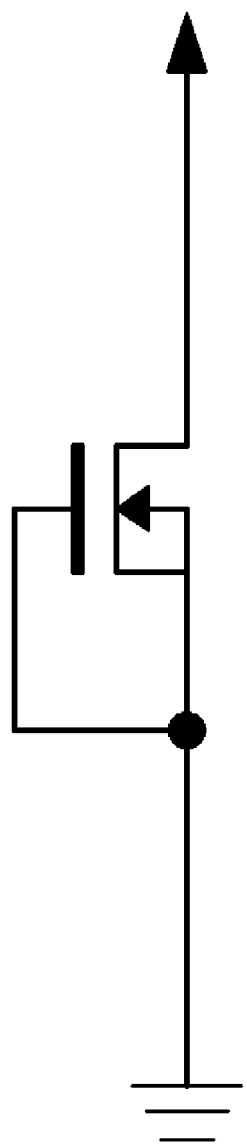
FIGS. 2a and 2b are a circuit diagram and a sectional view of a DDDNMOS device, which include a drain formed through double-diffusion of impurities.
Figure 2B:
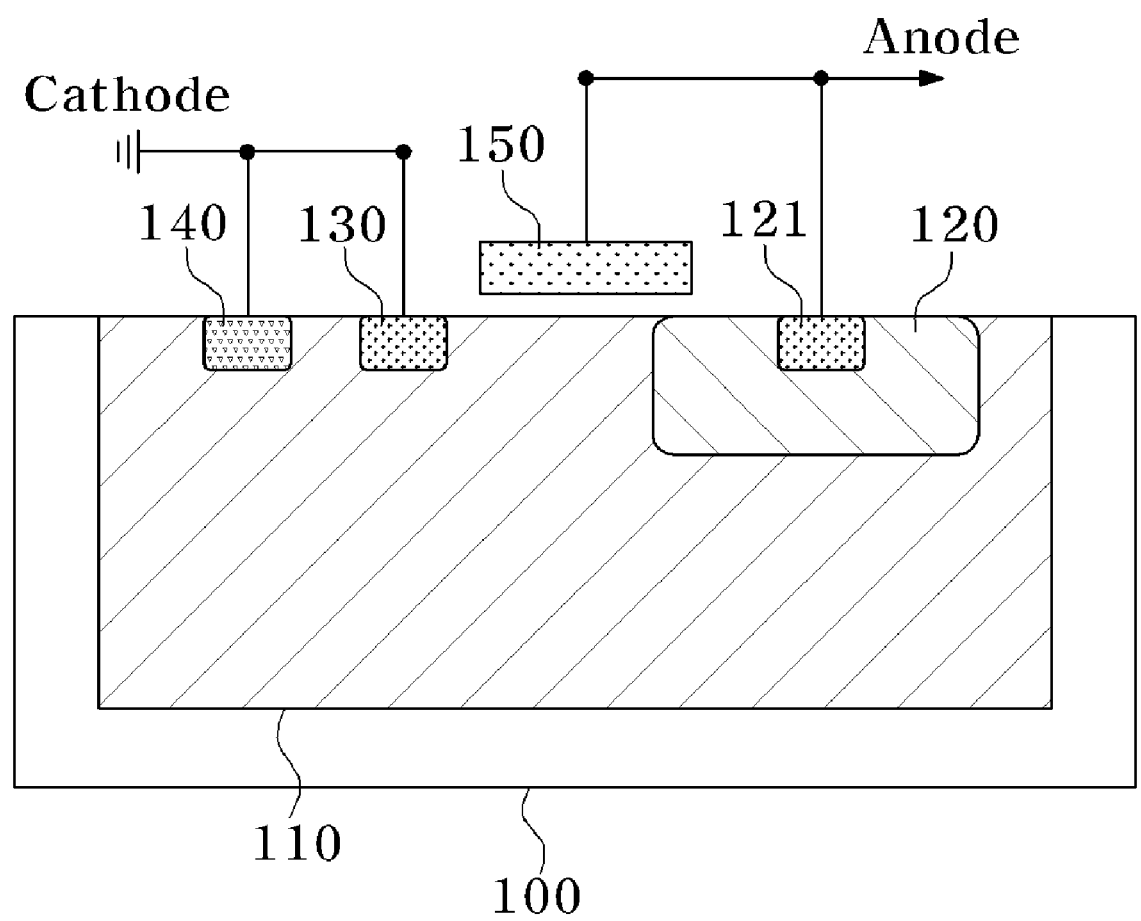
Figure 5:
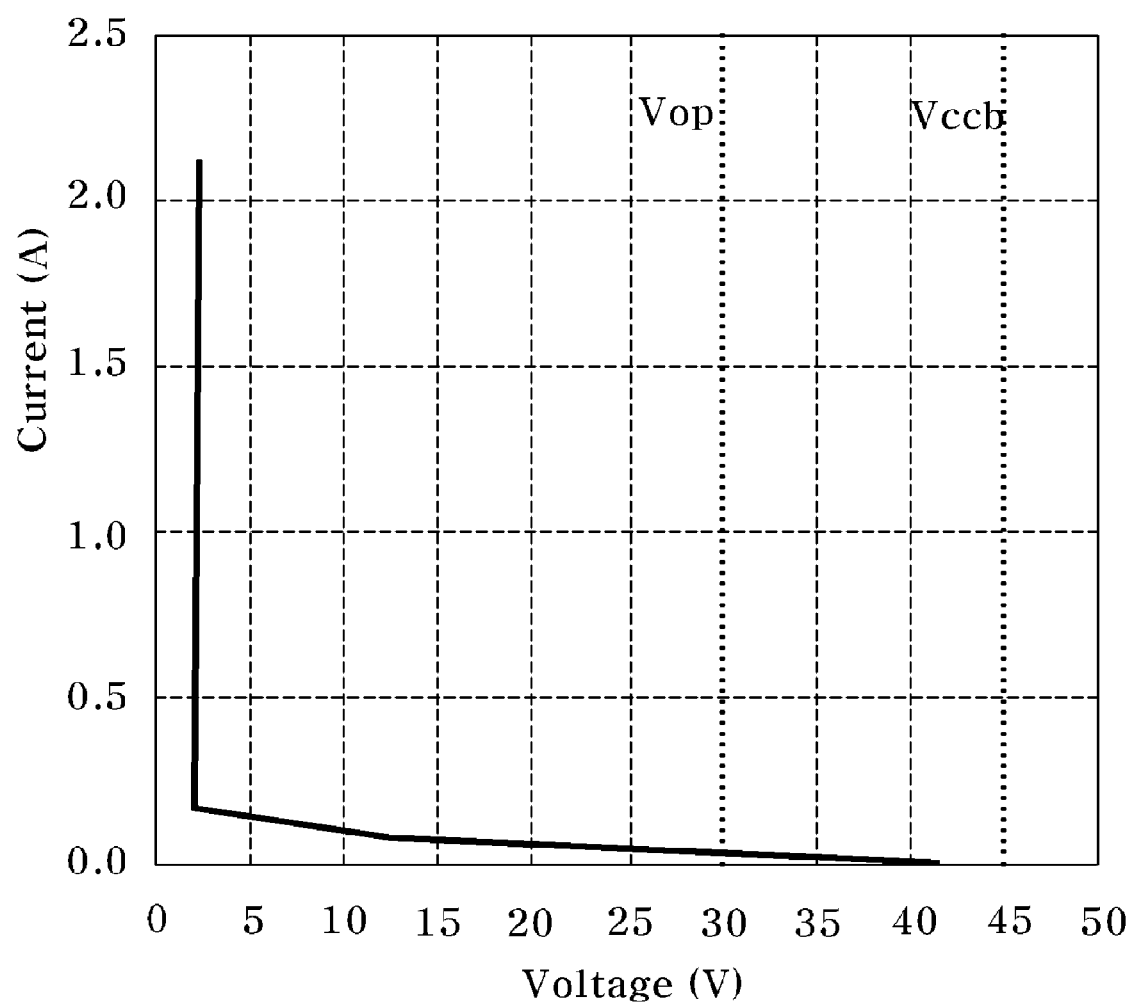
FIG. 5 is a graphical representation depicting electrical characteristics of a rectifier in current discharge conditions.

FIG. 5 is a graphical representation depicting electrical characteristics of a rectifier in current discharge conditions. The electrical characteristics of an N-type rectifier used as the ESD protection device will be evaluated by comparing with the conditions of FIG. 1.

First, the avalanche voltage Vav and the triggering voltage Vtr of the rectifier are greater than the operating voltage of a microchip during normal operation of the microchip. Second, the triggering voltage of the rectifier is substantially similar to or higher than the core circuit breakdown voltage Vccb of the microchip under the circumstance that ESD stress is generated in the microchip. As a result, it is difficult for the rectifier to provide fundamental shield with respect to the electrostatic current flowing to the microchip so as not to flow to and break the core circuit of the microchip. Third, in general, the snapback holding voltage Vh of the rectifier is considerably lower than the operating voltage of the microchip. As a result, the latch-up phenomenon is ready to occur due to the rectifier during normal operation of the microchip. Fourth, the thermal breakdown voltage Vtb of the rectifier is significantly lower than the triggering voltage thereof. Accordingly, in the multi-finger structure, the respective fingers of the rectifier are likely to operate non-uniformly. Generally, the rectifier exhibits excellent current immunity per unit size.

Consequently, although the rectifier exhibits excellent efficiency in terms of layout area, the rectifier has a limit in providing sufficiently stable protection for the core circuit of the microchip. Furthermore, the rectifier is not suitably used as the ESD protection device due to the problems of the latch-up phenomenon and non-linearity of current immunity in the multi-finger structure. Accordingly, there is a need to solve such problems in order to use the rectifier as the ESD protection device.

The present disclosure provides a technology of preventing the latch-up phenomenon by increasing operation resistance through improvement of the existing rectifier structure in order to solve the problems of existing ESD protection devices. Further, the present disclosure provides a technology of providing sufficient protection to a core circuit of a microchip by lowering the triggering voltage Vtr under the circumstances that electrostatic stress is introduced into the microchip.

Figure 6A:
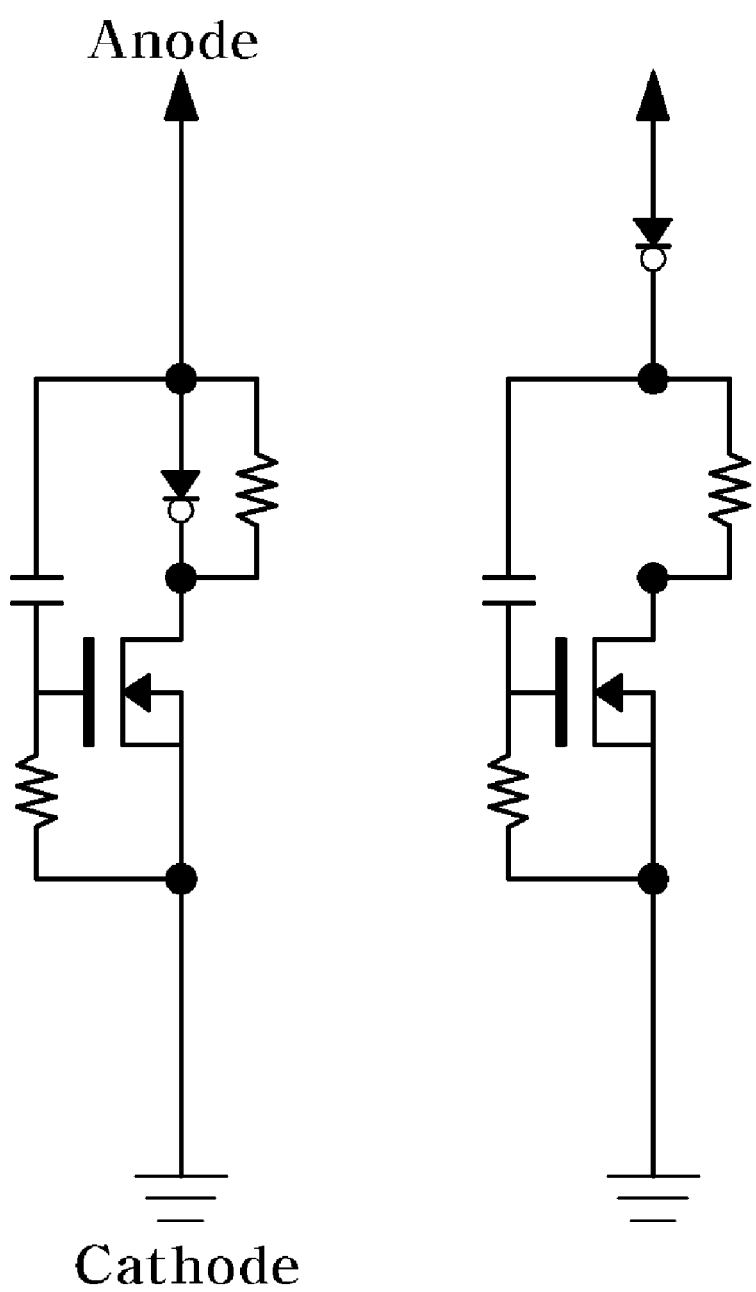
FIGS. 6a and 6b are a circuit diagram and a sectional view of an ESD protection device according to an exemplary embodiment of the present disclosure.
Figure 6B:
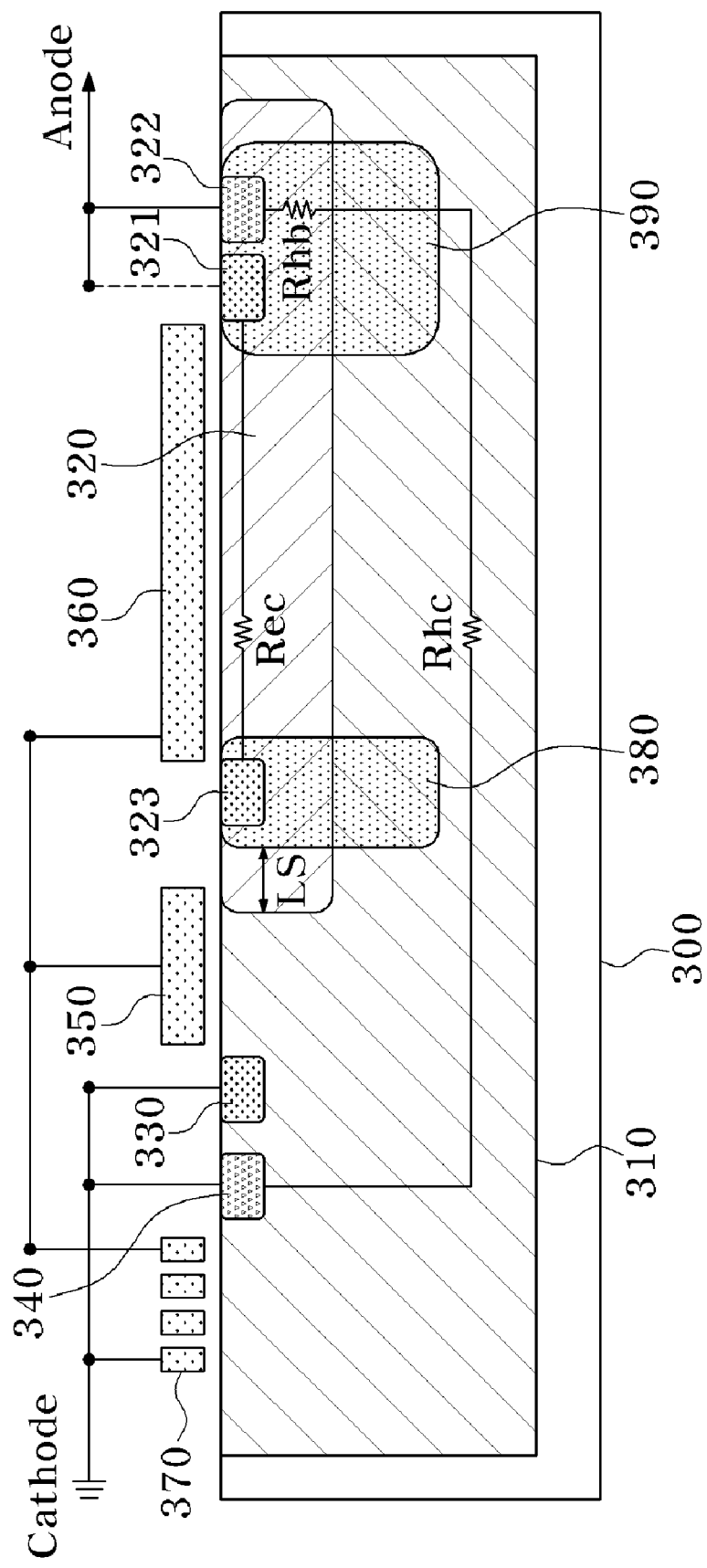

FIGS. 6a and 6b are a circuit diagram and a sectional view of an ESD protection device according to an exemplary embodiment of the present disclosure, respectively.

In the ESD protection device according to the embodiment, a P well 310 is formed on a P-type semiconductor substrate 300. Although conditions for forming the high voltage P well 310 through impurity implantation may be changed depending on processes, the high voltage P well 310 has an impurity density of about $10^{12}$ cm$^{-3}$. An anode N-drift region 320 is formed in the high voltage P well 310. The anode N-drift region 320 is formed at an impurity density of about $10^{13}$ cm$^{-3}$. An anode N+ diffusion region 321 and an anode P+ diffusion region 322 are formed in the anode N-drift region 320. Next, a buffer N+ diffusion region 323 is formed with a predetermined distance separating the N+ diffusion region 323 and the anode N+ diffusion region 321 from each other to have a constant electrical resistance $R_{eb}$ between the N+ diffusion region 323 and the anode N+ diffusion region 321. N-type impurities are implanted at a density of about $10^{15}$~$10^{16}$ cm$^{-3}$ to the anode N+ diffusion region 321 and the buffer N+ diffusion region 323, and P-type impurities are also implanted at a density of about $10^{15}$~$10^{16}$ cm$^{-3}$ to the anode P+ diffusion region 322. A cathode N+ diffusion region 330 and a cathode P+ diffusion region 340 are formed in the high voltage P well 310 outside the anode N-drift region 320. N-type impurities are implanted at a density of about $10^{15}$~$10^{16}$ cm$^{-3}$ to the cathode N+ diffusion region 330, and P-type impurities are also implanted at a density of about $10^{15}$~$10^{16}$ cm$^{-3}$ to the cathode P+ diffusion region 340. A MOSFET gate 350 is formed on the semiconductor substrate between the cathode N+ diffusion region 330 and the buffer N+ diffusion region 323. In this case, the cathode N+ diffusion region 330 is disposed adjacent the MOSFET gate 350 and the anode N-drift region 320 is disposed adjacent the MOSFET gate 350 or overlaps the MOSFET gate 350. The buffer N+ diffusion region 323 is separated a predetermined distance from the MOSFET gate 350.

A capacitor electrode 360 is formed on the semiconductor substrate between the anode N+ diffusion region 321 and the buffer N+ diffusion region 323. Since the anode N+ diffusion region 321 is separated a predetermined distance from the buffer N+ diffusion region 323, the capacitor electrode 360 has a considerably wide area. Accordingly, a capacitor formed between the anode N+ diffusion region 321 and the capacitor electrode 360 has considerably large capacitance.

A polysilicon layer 370 is formed above the high voltage P well 310 outside the anode N-drift region 320 and will be used as a resistor. In this case, the polysilicon layer 370 may be formed to have a small width and a large length to make electrical resistance as large as possible in a given area.

A buffer N-ballistic region 380 is formed to completely surround the buffer N+ diffusion region 321. The buffer N-ballistic region 380 is formed to pass through the anode N-drift region 320 in a depth direction by implanting N-type impurities at a density of about $10^{13}$~$10^{14}$ cm$^{-3}$ with a sufficiently large implantation energy.

In addition, an anode N-ballistic region 390 is formed to surround both the anode N+ diffusion region 321 and the anode P+ diffusion region 322. In this case, impurity implantation for forming the anode N-ballistic region 390 is carried out under the same condition as that of the buffer N-ballistic region 380. After forming the structure described above, the cathode N+ diffusion region 330 and the cathode P+ diffusion region 340 are connected together to constitute a cathode. In constitutions of an anode, the anode N+ diffusion region 321 and the anode P+ diffusion region 322 may be connected together to the anode, or otherwise, only the anode P+ diffusion region 322 may be directly connected to the anode without directly connecting the anode N+ diffusion region 321, as indicated by a dotted line of FIG. 6b. When the anode N+ diffusion region 321 is directly connected to the anode, other by-pass courses as well as the P+ diffusion region/N diode are formed between the cathode and the anode. On the contrary, when the anode N+ diffusion region 321 is not directly connected to the anode, there is no by-pass course except for the P+ diffusion region/N diode between the cathode and the anode. The capacitor electrode 360 and the MOSFET gate 350 are connected at one end thereof to each other, and the connected ends thereof are connected to one end of a resistor polysilicon 370. The other end of the resistor polysilicon 370 is connected to the cathode.

With this configuration, the cathode P+ diffusion region 340, cathode N+ diffusion region 330, MOSFET gate 350, anode N-drift region 320, and buffer N+ diffusion region 380 formed in the high voltage P well 310 constitute a double diffused drain N-Type MOSFET (DDDNMOS). Although the buffer N+ diffusion region 380 is not directly connected to the anode, the buffer N+ diffusion region 380 is connected to the anode N+ diffusion region 321 and the anode N-drift region 320, which are directly connected to the anode, so that the buffer N+ diffusion region 380 is substantially connected to the anode. The MOSFET gate 350 of the DDDNMOS is coupled to the anode through the capacitor gate 360 and is also coupled to the cathode through the resistor polysilicon 370. Namely, the DDDNMOS formed in the structure according to the embodiment of the present disclosure becomes a gate coupled double diffused drain N-type MOSFET (GCD-DDNMOS) structure, wherein the gate is coupled to the anode and the cathode through a capacitor and a resistor, respectively.

Further, two bipolar transistor (BJT) structures, that is, a lateral NPN BJT (LNPN BJT) which is constituted by the anode N+ diffusion region 321, anode N-drift region 320, high voltage P well 310 and cathode N+ diffusion region 330, and a vertical PNP BJT (VPNP BJT) which is constituted by the cathode P+ diffusion region 340, high voltage P well 310, anode N-drift region 320 and anode P+ diffusion region 322, are formed between the anode and the cathode. After forming the configuration as shown in FIGS. 6a and 6b, rectifier operation is carried out to allow an electrostatic current to flow between the anode and the cathode by connecting the cathode to a ground and applying a positive voltage to the anode. Next, this operation will be described in more detail.

(1) Normal Channel Operation of GCDDDNMOS Structure

In the DDDNMOS constituted by the cathode P+ diffusion region 340, cathode N+ diffusion region 330, MOSFET gate 350, anode N-drift region 320, and buffer N+ diffusion region 323 formed in the high voltage P well 310, the gate of the DDDNMOS is coupled to the anode through the capacitor. Accordingly, when the anode becomes an electrically positive state by electrostatic current flowing thereto, the gate of the DDDNMOS also becomes an electrically positive state. As a result, a channel under the gate of the DDDNMOS is opened and allows the electrostatic current to be primarily discharged through the channel operation of the DDDNMOS between the cathode and the anode. Since the channel operation of the GCDDDNMOS is sensitive to electrostatic stress of low voltage, the GCDDDNMOS is advantageous in terms of effective discharge of the electrostatic current rapidly flowing thereto, but exhibits an insufficient capability in coping with a large amount of electrostatic current.

(2) NPN BJT Operation of GGDDDNMOS Structure

Figure 3:
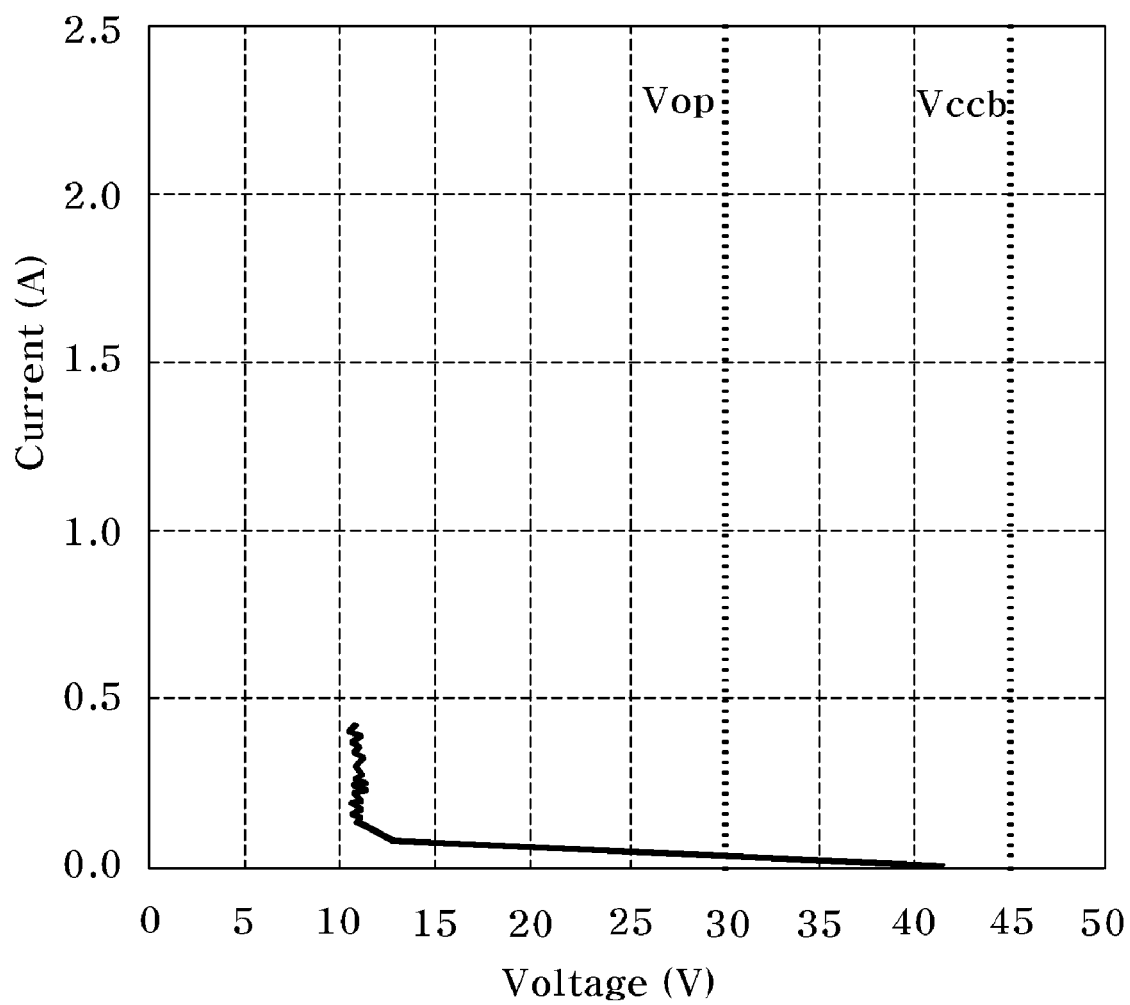
FIG. 3 is a graphical representation depicting typical voltage-current characteristics of a GGDDDNMOS device operating as an ESD protection device.

When electrostatic current surges, the GCDDDNMOS operates earlier than any other elements through the channel operation, thereby providing an advantage of effective discharge of the electrostatic stress of low voltage, but cannot cope with a large amount of electrostatic current. Further, according to characteristics of the channel operation, when a predetermined amount or more of electric current flows through the channel, voltage at both ends of the channel increases rapidly, causing operation of the LNPN BJT in the DDDNMOS. Generally, the DDDNMOS undergoes thermal breakdown immediately after the operation of the NPN BJT is triggered (see FIG. 3). However, the DDDNMOS in the device according to the embodiment of the present disclosure includes the buffer N-ballistic region 380 formed to surround the buffer N+ diffusion region 323, thereby providing an effect of uniformly distributing the electrostatic current in the device in the depth direction by preventing the electrostatic current from crowding on the surface of the device.

Accordingly, the DDDNMOS in the device according to the embodiment may contribute to communication of a great amount of electrostatic current between the cathode and the anode through operation of the LNPN BJT. Further, although the buffer N+ diffusion region 323 operates like the drain N+ diffusion region under the circumstances that the LNPN BJT operates, the buffer N+ diffusion region 323 is connected to the anode, through which electrons acting as carriers of the electrostatic current are finally discharged, via the constant electrical resistance Rec, which contributes to an increase in operation resistance of the LNPN BJT. Accordingly, the DDDNMOS of the device according to the embodiment doses not suffer from the snapback phenomenon, which occurs upon operation of the LNPN BJT of the existing GGD-DDNMOS.

(3) Operation of Rectifier of High On-Resistance

In the configuration shown in FIGS. 6a and 6b, both of the LNPN BJT and the VPNP BJT are formed. When operation of the LNPN BJT is first triggered, electrons temporarily tend to crowd excessively in the anode N-drift region 320, which is a collector of the LNPN BJT, thereby triggering operation of the VPNP BJT. Consequently, the LNPN BJT and the VPNP BJT couple to each other and cooperate to perform rectifier operation for discharging a large amount of current. Generally, the rectifier operation involves problems, such as the latch-up phenomenon, non-linearity of a current immunity level in the multi-finger structure, due to excessively low operation resistance. However, since the device according to the embodiment maintains the operation resistance to be comparatively higher than the existing rectifier operation, the device according to the embodiment does not suffer from such problems as compared with the existing ESD protection devices. The reason behind this will now be described in more detail.

When emitted from the anode P+ diffusion region 322, which is an emitter of the VPNP BJT, holes are difficult to pass through a base thereof. In the device according to the embodiment, the base of the VPNP BJT is a region where the anode N-drift region 320 and the anode N-ballistic region 380 overlap. Since both the anode N-drift region 320 and the anode N-ballistic region 380 are formed by implantation of the N-type impurities, these regions have higher densities of electrons, which act as obstacles against movement of the holes, than that of the base of the existing rectifier. Accordingly, a relatively large amount of holes tend to be extinguished while passing through the base, causing an increase in operation resistance of the VPNP BJT.

Further, the collector region of the VPNP BJT, that is, the cathode P+ diffusion region 340 and the high voltage P well 310, has a considerably high background resistance Rhc. In the device according to the embodiment, the anode P+ diffusion region 322 and the buffer N+ diffusion region 370 are separated a considerably long distance from each other. This structure provides an extended path of the high voltage P well 310, which is part of the collector region of the VPNP BJT, thereby causing an increase in electrical resistance of the holes moving through this path.

Operating speed of the rectifier having the structure according to the embodiment of the present disclosure is higher than the existing rectifier due to the following reasons. Discharge of the holes becomes fast from the anode P+ diffusion region 322, which is the emitter of the VPNP BJT, to the base of the VPNP BJT. In the device according to the embodiment, the base of the VPNP BJT is the region where the anode N-drift region 320 and the anode N-ballistic region 390 overlap. Both of the anode N-drift region 320 and the anode N-ballistic region 390 are formed by implantation of the N-type impurities and thus have high densities of the impurities. Accordingly, voltage to be surmounted to discharge the holes from the anode P+ diffusion region 322 to the base thereof is lowered. Consequently, the operation of the VPNP BJT is faster than the existing device, which results in fast rectifier operation of the device according to the embodiment.

On the other hand, when the anode is constituted by connecting only the anode P+ diffusion region 322 to the anode without directly connecting the anode N+ diffusion region 321, this configuration is substantially the same as the configuration having a single forward operation diode connected in series to the overall rectifier structure. Accordingly, the overall operation resistance of the rectifier may increase corresponding to operation resistance resulting from the forward operation of the diode.

The ESD protection device for high voltage operation according to the embodiment exhibits fast operation speed and has a sufficiently high operation resistance of the rectifier due to the configuration where the gate of the DDDNMOS is coupled to the anode. Thus, the device according to the embodiment will be named as a high voltage operating high on-resistance gate coupled rectifier (HVOHORGCR).

Figure 7A:
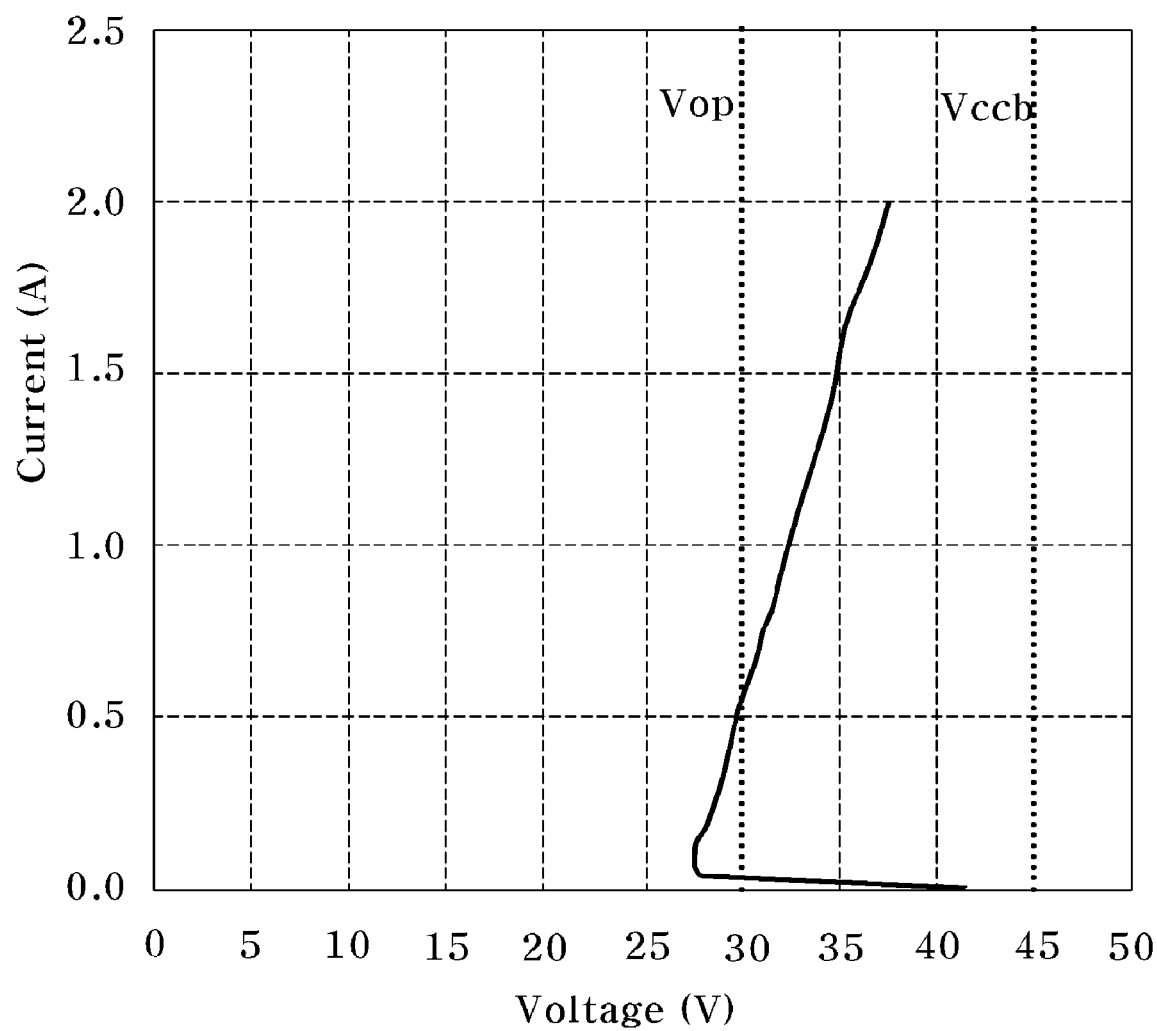
FIGS. 7a and 7b are graphical representations respectively depicting voltage-current characteristics of the ESD protection device during normal operation and upon inflow of electrostatic current, according to the embodiment of the present disclosure.
Figure 7B:
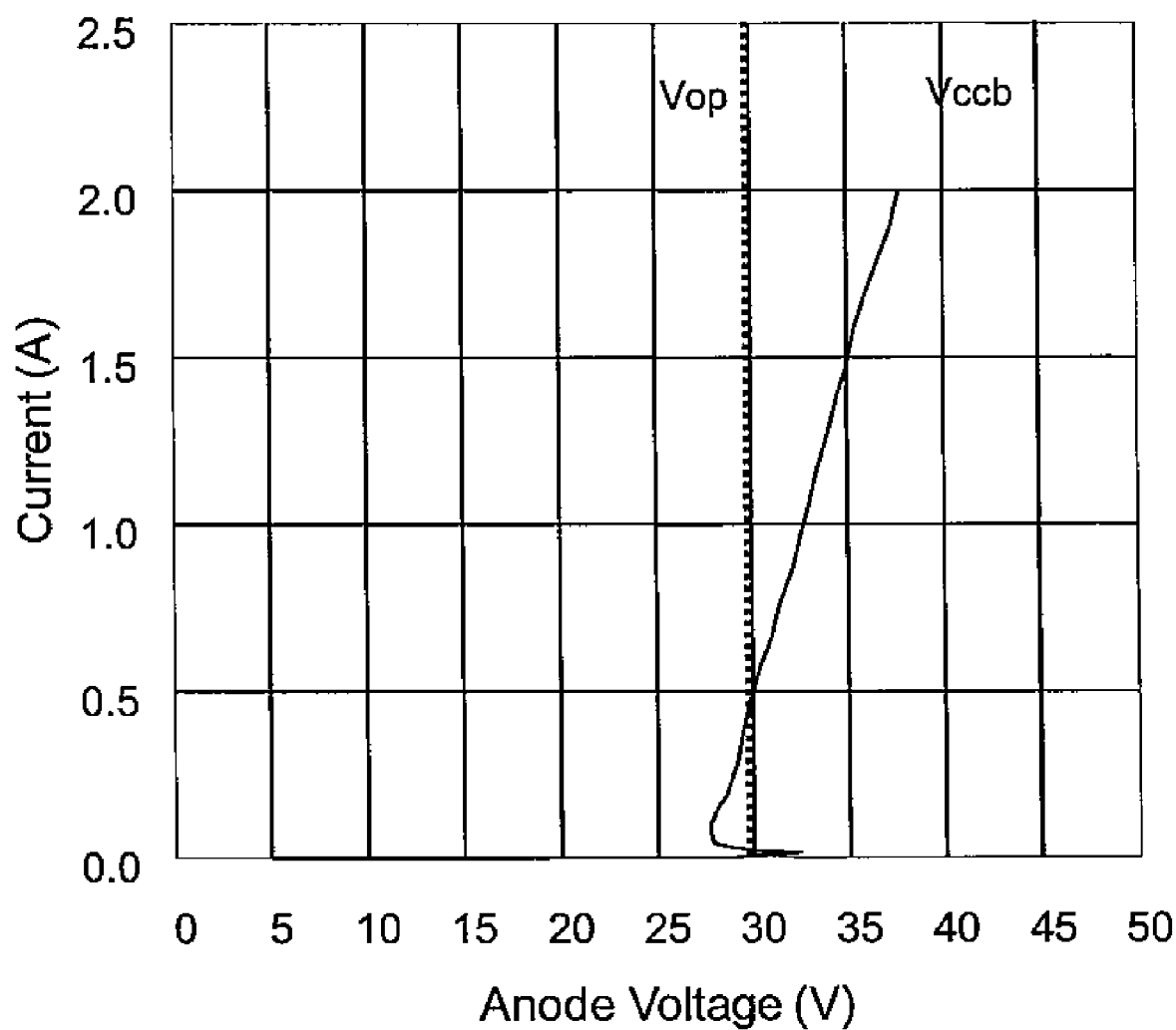

FIGS. 7a and 7b are graphical representations respectively depicting voltage-current characteristics of the ESD protection device during normal operation and upon inflow of electrostatic current, according to the embodiment of the present disclosure.

During normal operation of a microchip, the avalanche voltage Vav and the triggering voltage Vtr of the HVO-HORGCR are greater than the operation voltage Vop of the microchip. The first operation of the HVOHORGCR coping against electrostatic stress is the channel operation of the GCDDDNMOS. Accordingly, it is possible for the HVO-HORGCR to provide effective coping against electrostatic stress of low voltage. Specifically, when the microchip is subjected to ESD stress, the triggering voltage of the HVO-HORGCR may be lowered than the core circuit breakdown voltage Vccb of the microchip. Thus, the HVOHORGCR may provide fundamental shield with respect to the electrostatic current flowing into the microchip so as to prevent the electrostatic current from flowing to and breaking the core circuit of the microchip.

The snapback holding voltage Vh of the HVOHORGCR may be maintained to be greater than or at least similar to the operation voltage of the microchip. Accordingly, during normal operation of the microchip, there is no likelihood of the latch-up phenomenon caused by the HVOHORGCR. Further, the thermal breakdown voltage Vtb of the HVOHORGCR may be maintained to be significantly greater than the triggering voltage Vtr. When adopting the multi-finger structure, the respective fingers of the rectifier operate uniformly.

Further, the HVOHORGCR exhibits excellent current immunity per unit area. Upon rectifier operation of the HVOHORGCR, the current widely spreads by flowing not only on the surface of the HVOHORGCR but also in the depth direction thereof, so that the HVOHORGCR may discharge a considerably large amount of electrostatic current over the size of the device. Generally, although there is a difference in discharging amount of the electrostatic current depending on processes, the HVOHORGCR may cope with an electrostatic current of about 30~60 mA/μM per unit size.

As such, the ESD protection device according to the embodiment of the present disclosure, that is, the HVOHORGCR, may solve the problems of the existing GGDDDNMOS and the existing rectifiers for high voltage operation, while satisfying both fundamental requirements and optimal requirements for the ESD protection device.

Figure 8A:
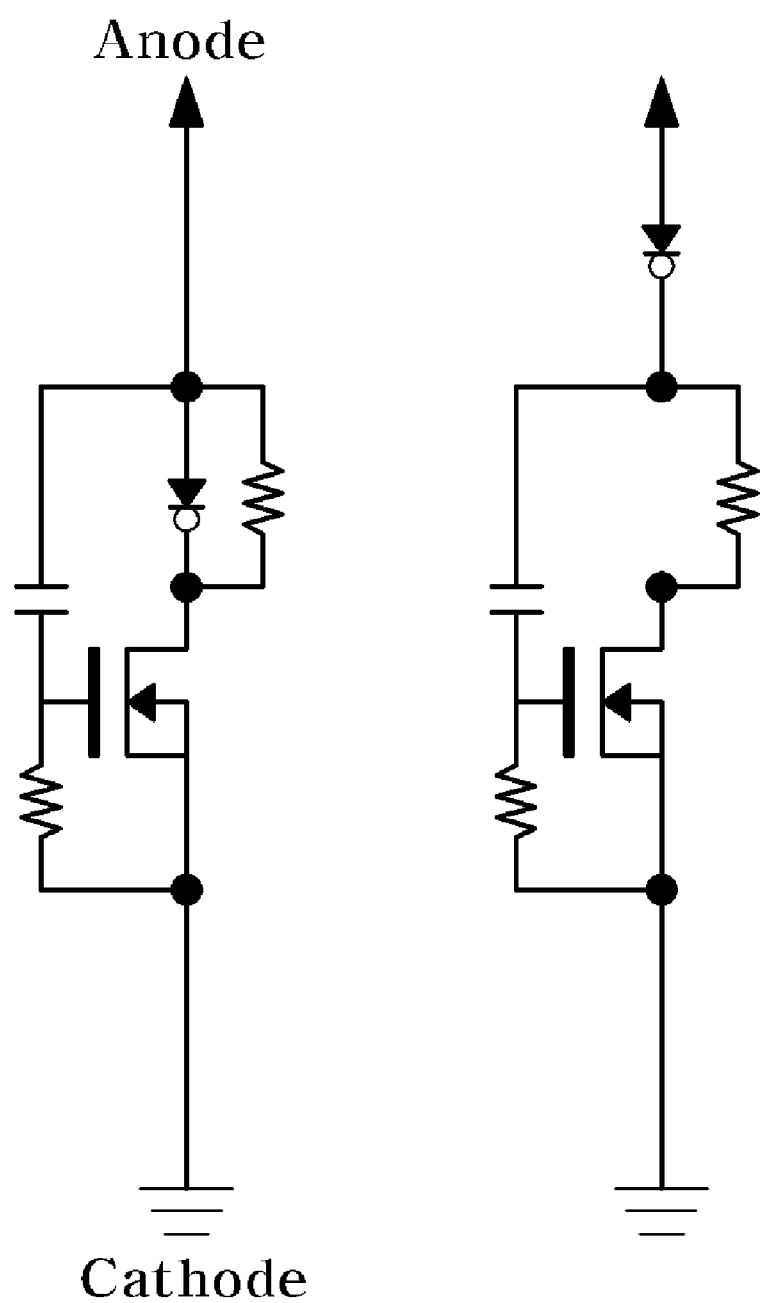
FIGS. 8a and 8b are a circuit diagram and a sectional view of an ESD protection device according to another exemplary embodiment of the present disclosure.
Figure 8B:
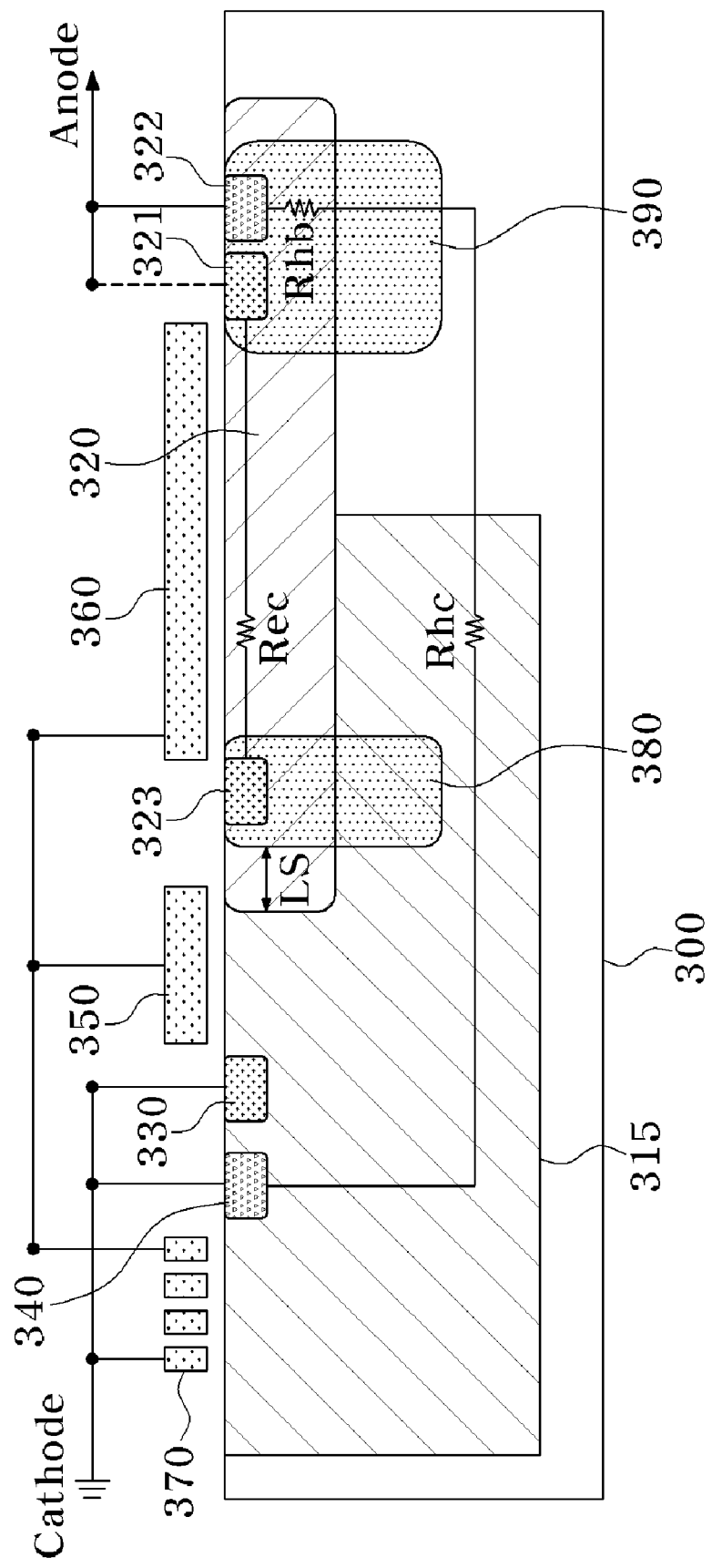

FIGS. 8a and 8b are a circuit diagram and a sectional view of an ESD protection device according to another exemplary embodiment of the present disclosure.

The rectifier operation through cooperation between the LNPN BJT operation and the VPNP BJT operation coupled to each other has a very low operation resistance. Thus, even when the operation resistance is increased by changing the structure and the impurity implantation condition in the HVOHORGCR, the increase in operation resistance may be insufficient. In this case, the ESD protection device may be modified as follows to achieve a further increase of the operation resistance.

Referring to FIG. 8b, in a device having the same configuration as the HVOHORGCR shown in FIG. 6b, resistance of the collector region of the VPNP BJT is increased by reducing part of a high voltage P well.

In this case, the part of the high voltage P well 310 is reduced such that an interface between the reduced high voltage P well 315 and the P-type semiconductor substrate 300 is located between the anode N-ballistic region 390 and the buffer N-ballistic region 380. In the HVOHORGCR, the collector of the VPNP BJT is formed by an overlapped region between the cathode P+ diffusion region 340 and the high voltage P well 310. When the high voltage P well 315 is narrowed as shown, part of a movement path of the holes acting as main carriers of electric current during operation of the VPNP BJT is changed from the high voltage P well 315 to the semiconductor substrate 300. Here, although the semiconductor substrate 300 is also the P-type region like the high voltage P well 315, the semiconductor substrate 300 acts as a highly resistant path with respect to the holes which pass through the semiconductor substrate 300, since the hole density of the semiconductor substrate 300 is much lower than that of the high voltage P well 315. Namely, the collector resistance Rhc increases in view of motion of the holes. As a result, operation resistance of the VPNP BJT increases, causing an increase in operation resistance of the overall rectifier structure.

Since the interface of the reduced high voltage P well 315 is located between the anode N-ballistic region 390 and the buffer N-ballistic region 380, that is, since the environment of the buffer N-ballistic region 380 is the same as that of the HVOHORGCR, operation and electrical characteristics of the LNPN BJT in this modified device are the same as that of the HVOHORGCR.

FIGS. 9a, 9b 10a and 10b are circuit diagrams and sectional views of ESD protection devices according to alternative exemplary embodiments.

Figure 9A:
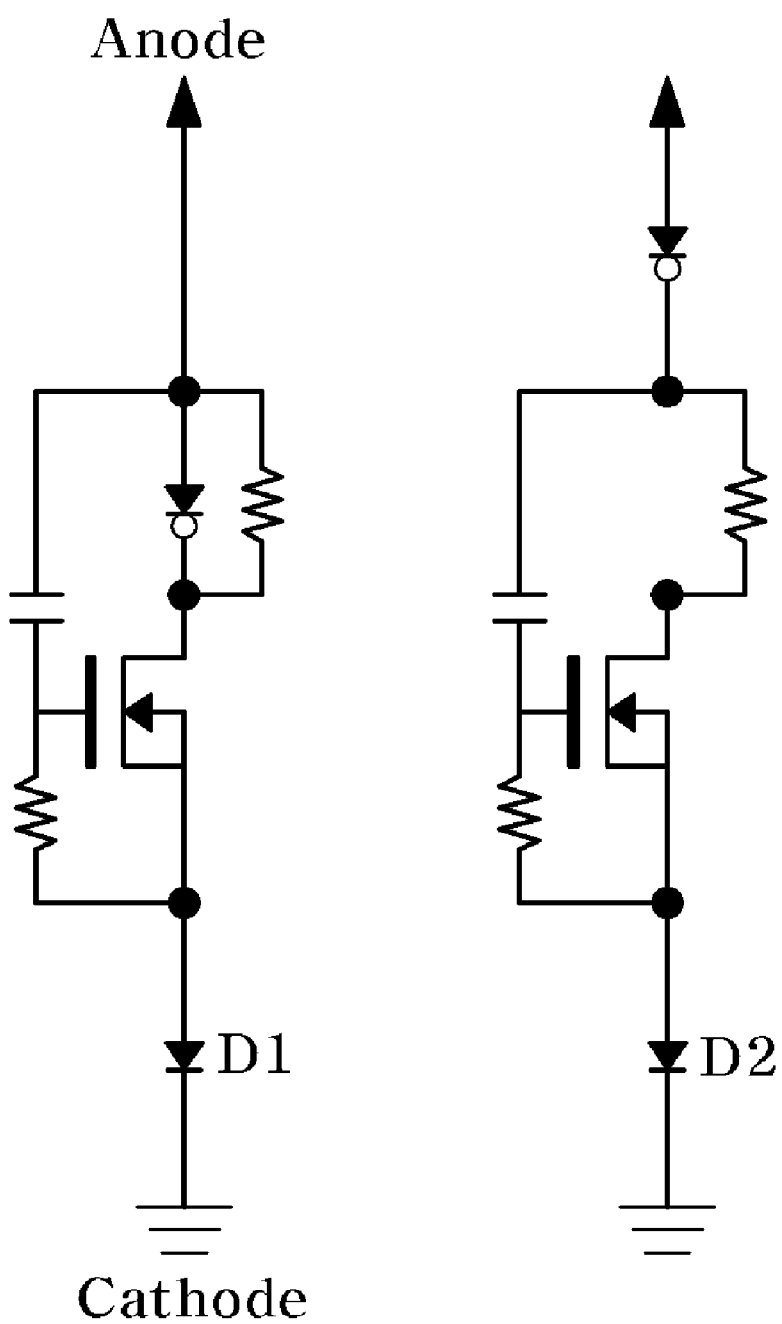
FIGS. 9a and 9b are a circuit diagram and a sectional view of an ESD protection device according to a further exemplary embodiment of the present disclosure.
Figure 9B:
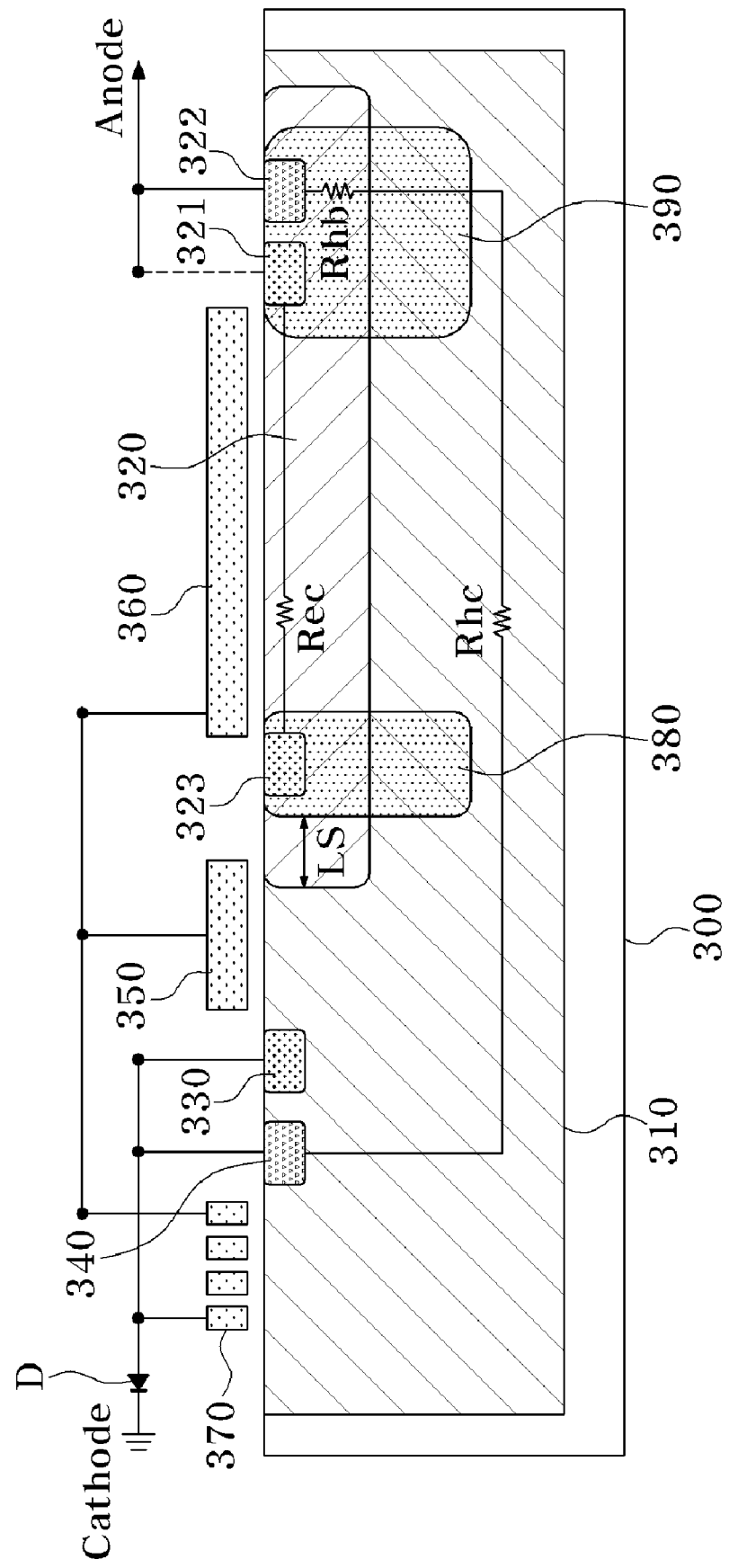

For the HVOHORGCR of FIGS. 6a and 6b, a diode may be connected in series to the cathode terminal of the HVOHORGCR to increase the overall operation resistance when the operation resistance is not sufficient. Specifically, as shown in FIGS. 9a and 9b, when a diode D (D1, D2) is added between a terminal to which the cathode N+ diffusion region 330 and the cathode P+ diffusion region 340 are connected and the cathode terminal, the overall operation resistance between the anode and the cathode may increase corresponding to operation resistance upon forward operation of the diode.

Figure 10A:
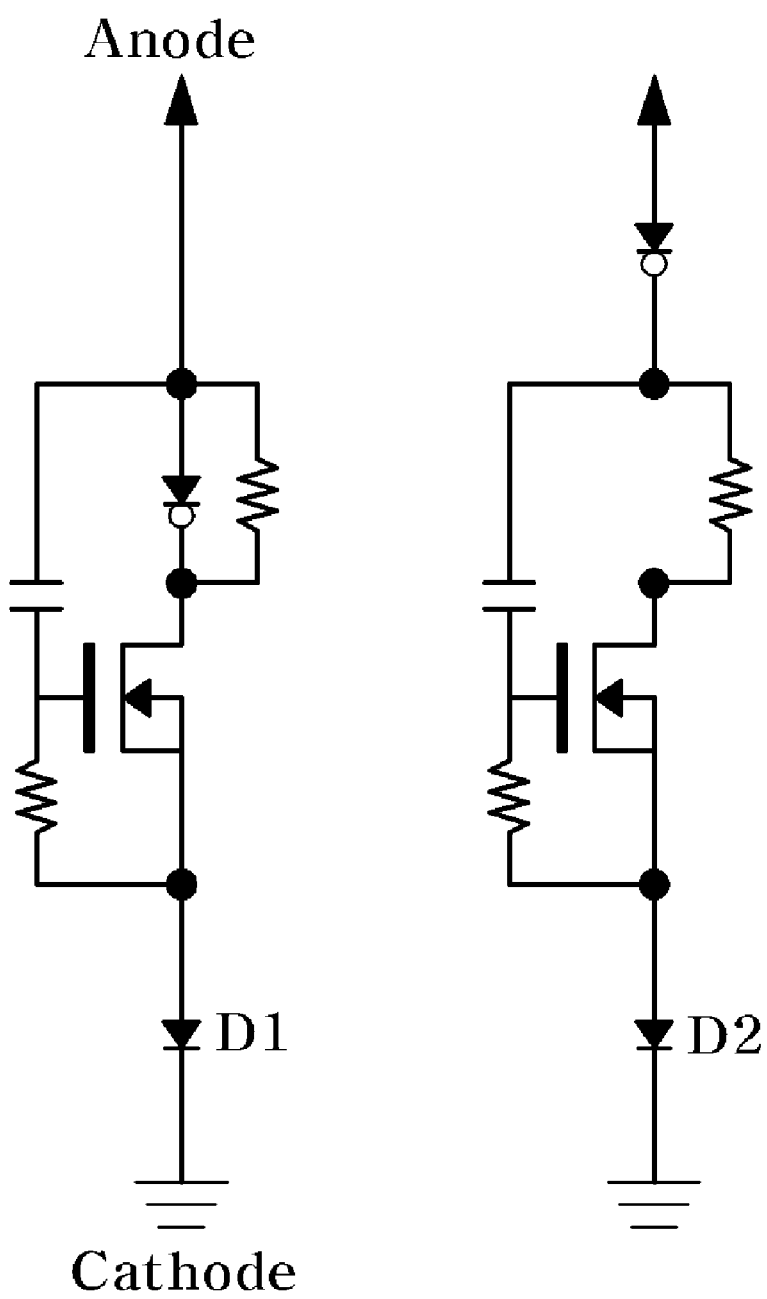
FIGS. 10a and 10b are a circuit diagram and a sectional view of an ESD protection device according to yet another exemplary embodiment of the present disclosure.
Figure 10B:
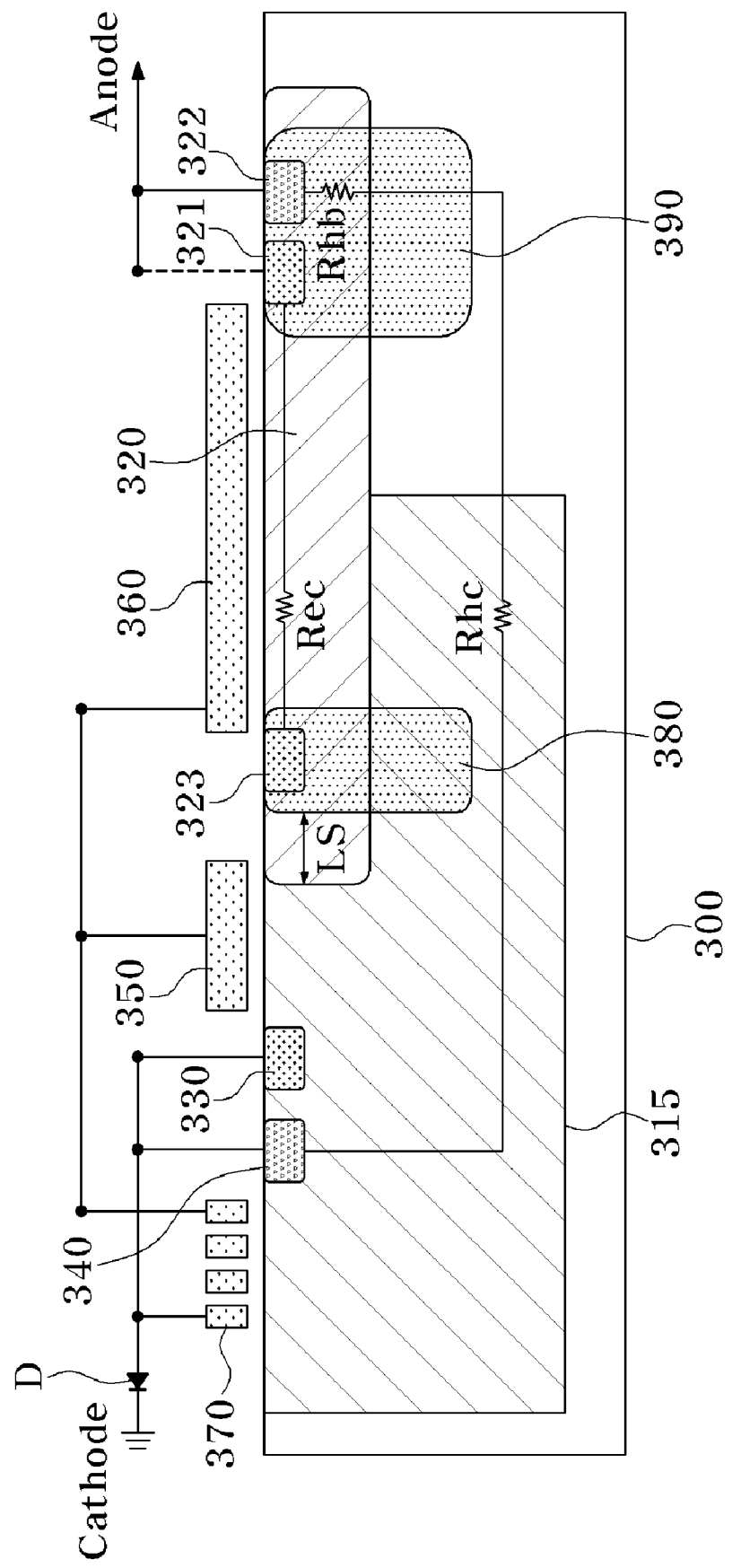

The method of increasing the overall operation resistance by adding the diode to the cathode terminal of the HVOHORGCR may also be applied to the device in which the high voltage P well 310 of the HVOHORGCR is reduced, as shown in FIGS. 10a and 10b.

In the above embodiment, the overall operation resistance is increased by adding a single diode to be connected in series to the cathode terminal of the HVOHORGCR or modified device thereof. However, several diodes may be added thereto to optimize the overall operation resistance.

FIGS. 11a, 11b, 12a and 12b are circuit diagrams and sectional views of ESD protection devices according to other exemplary embodiments of the present disclosure.

Figure 11A:
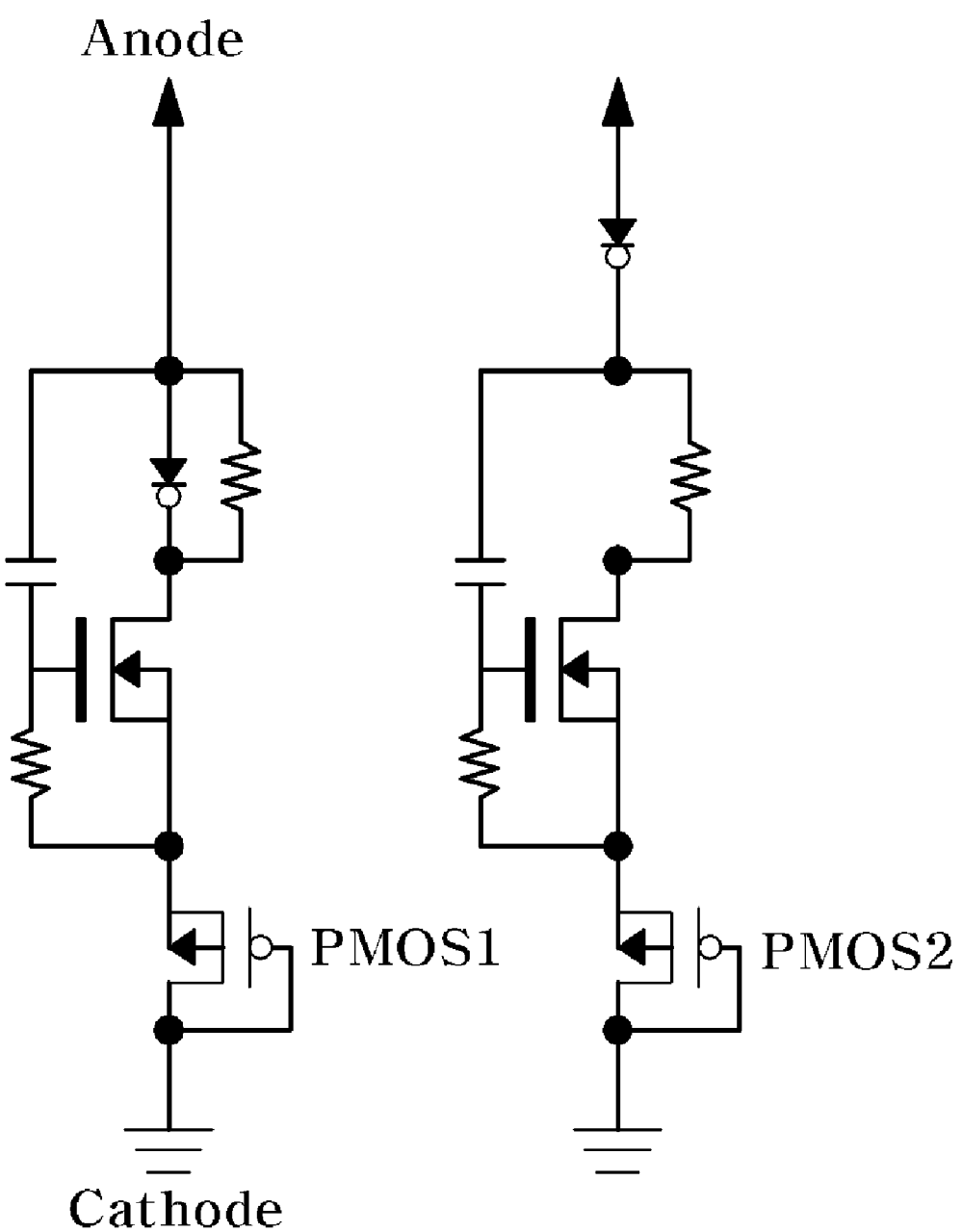
FIGS. 11a and 11b are a circuit diagram and a sectional view of an ESD protection device according to yet another exemplary embodiment of the present disclosure.
Figure 11B:
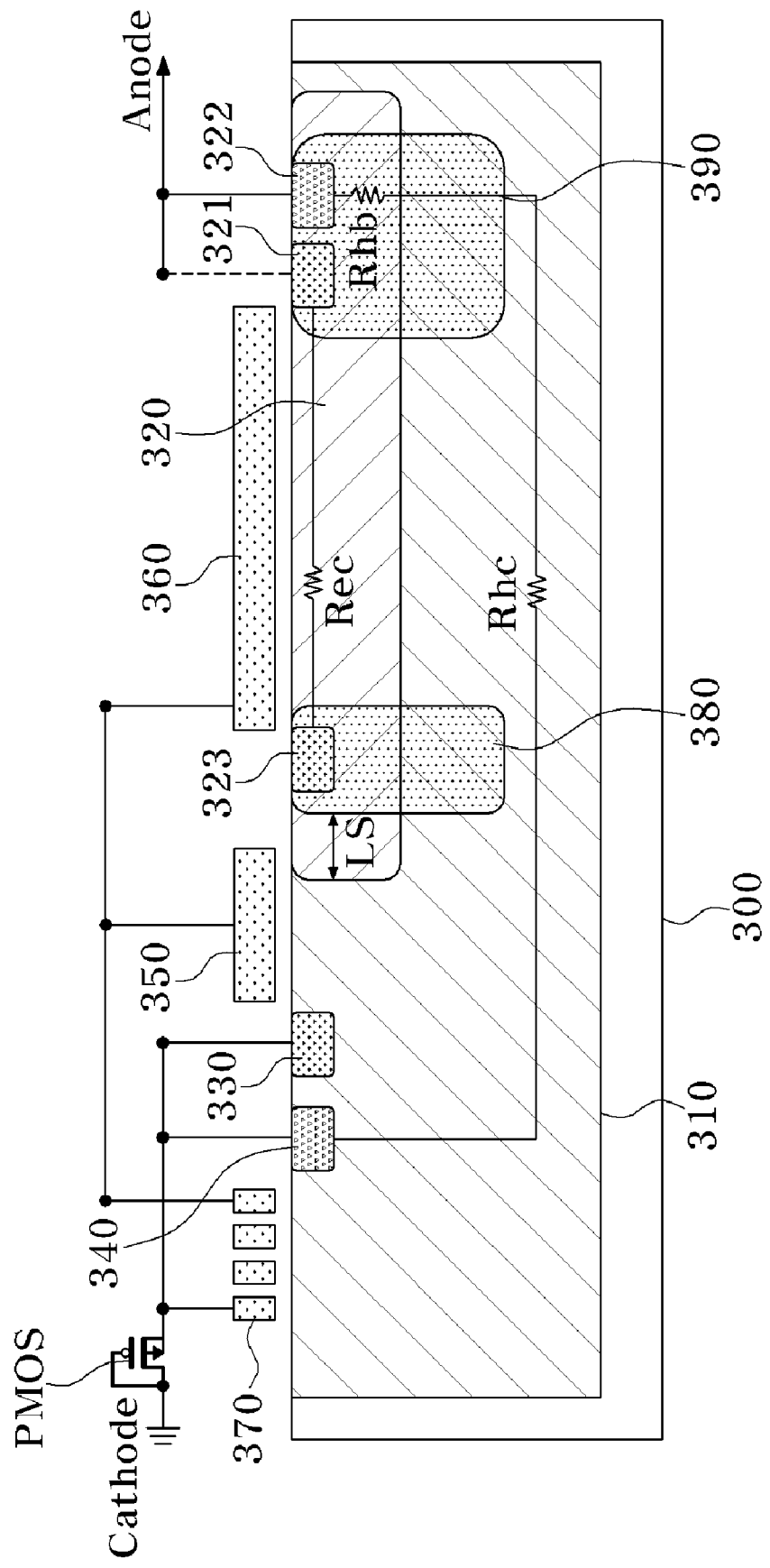
Figure 12A:
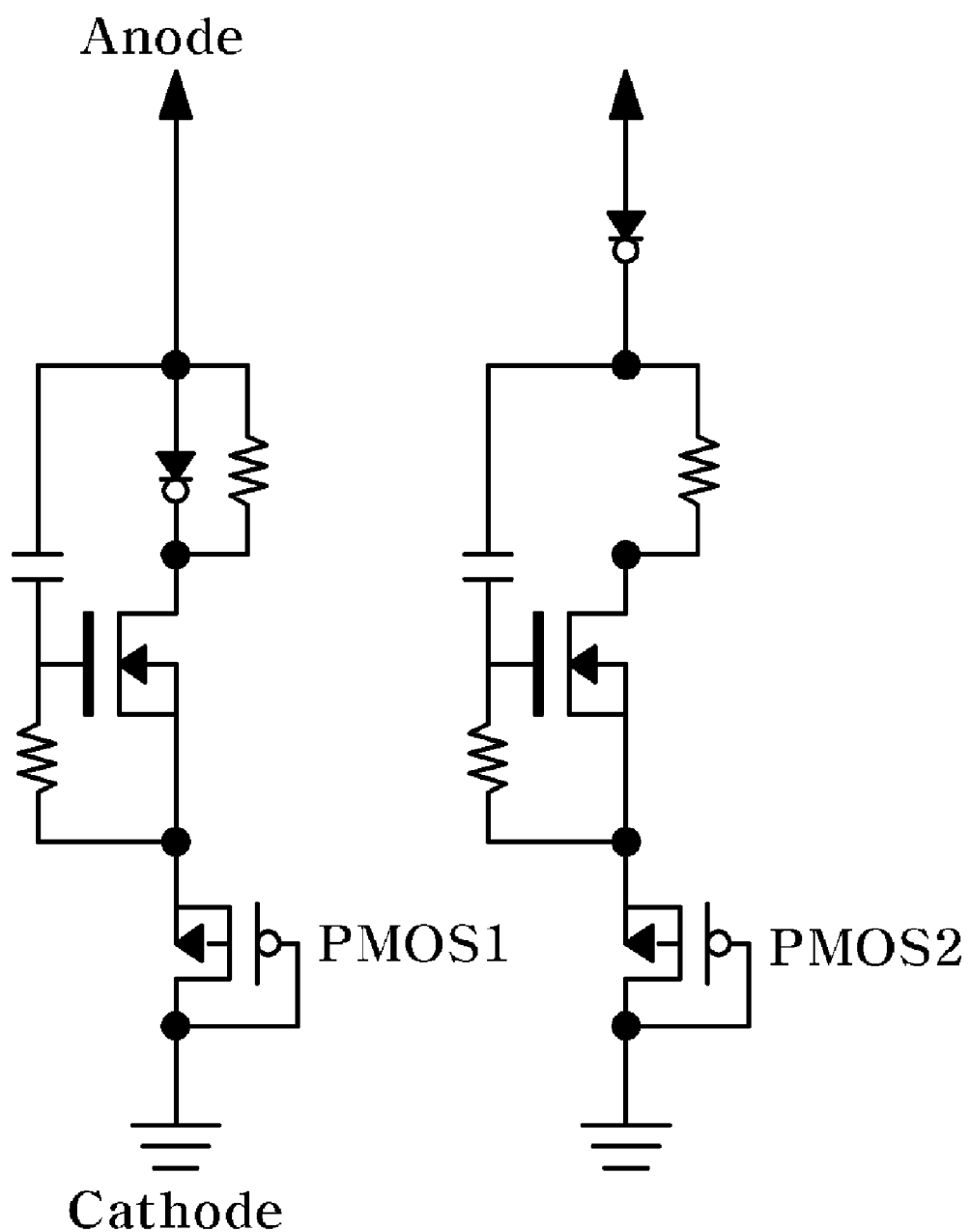
FIGS. 12a and 12b are a circuit diagram and a sectional view of an ESD protection device according to yet another exemplary embodiment of the present disclosure.
Figure 12B:
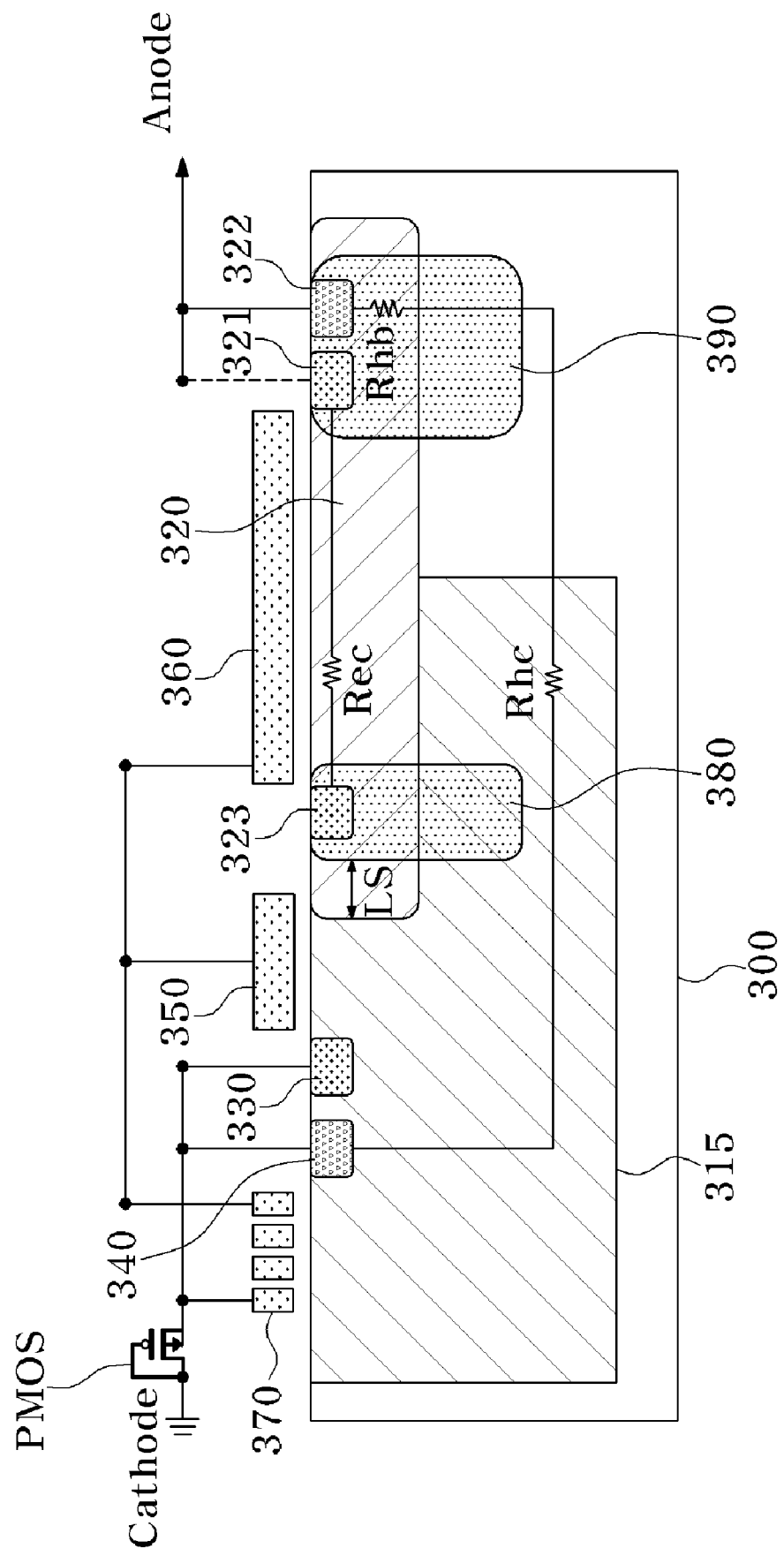

For the HVOHORGCR of FIGS. 6a and 6b, a P-type MOSFET may be connected in series to the cathode terminal of the HVOHORGCR to increase the overall operation resistance when the operation resistance is not sufficient. Specifically, as shown in FIGS. 11a and 11b, when the P-type MOSFET is added between a terminal to which the cathode N+ diffusion region 330 and the cathode P+ diffusion region 340 are connected and the cathode terminal, the overall operation resistance between the anode and the cathode may increase corresponding to operation resistance of the LPNP BJT operation in the P-type MOSFET. The method of increasing the overall operation resistance by adding the P-type MOSFET to be connected in series to the cathode terminal of the HVOHORGCR may also be applied to the device in which the high voltage P well 310 of the HVOHORGCR is reduced, as shown in FIGS. 12a and 12b.

The triggering voltage of the LPNP BJT of the P-type MOSFET is considerably high. Hence, when the P-type MOSFET is connected in series to the cathode terminal of the HVOHORGCR, not only the overall operation resistance but also the triggering voltage Vtr of the overall device increases. An increased amount of the triggering voltage Vtr by addition of the P-type MOSFET may be counterbalanced by reducing a distance between an edge of the anode N-drift region 320 and the buffer N-ballistic region 380 (LS→SS, LS>SS).

Although some embodiments are provided to illustrate the present disclosure, it should be understood that these embodiments are given by way of illustration only, and that various modifications, variations, and alternations can be made without departing from the spirit and scope of the present disclo-

What is claimed is:

1. An electrostatic discharge (ESD) protection device, comprising:
a high voltage P well formed in a semiconductor substrate;
an N-drift region formed in the high voltage P well;
an anode N+ diffusion region and an anode P+ diffusion region formed in the N-drift region;
a buffer N+ diffusion region formed in the N-drift region and separated a predetermined distant from the anode N+ diffusion region;
a buffer N-ballistic region surrounding the buffer N+ diffusion region;
an anode N-ballistic region surrounding the anode N+ diffusion region and the anode P+ diffusion region;
a cathode N+ diffusion region and a cathode P+ diffusion region formed in the high voltage P well and separated a predetermined distance from the N-drift region;
a MOSFET gate disposed on the semiconductor substrate between the cathode N+ diffusion region and the N-drift region; and
a capacitor electrode disposed on the semiconductor substrate between the anode N+ diffusion region and the buffer N+ diffusion region.

2. The ESD protection device according to claim 1, further comprising: a resistor polysilicon layer on the semiconductor layer outside the high voltage P well.

3. The ESD protection device according to claim 1, wherein the buffer N-ballistic region is formed at a density of $10^{13} \sim 10^{14}$ ions/cm$^3$ to pass through the N-drift region in a depth direction.

4. The ESD protection device according to claim 1, wherein the anode N-ballistic region is formed at a density of $10^{13} \sim 10^{14}$ ions/cm$^3$ to pass through the N-drift region in a depth direction.

5. The ESD protection device according to claim 1, wherein the anode N+ diffusion region and the anode P+ diffusion region are connected together to constitute an anode, or only the anode P+ diffusion region is connected to constitute the anode without directly connecting the anode N+ diffusion region.

6. The ESD protection device according to claim 2, wherein the capacitor electrode, the MOSFET gate and the resistor polysilicon layer are connected at one end thereof to one another and the other end of the resistor polysilicon layer is connected to a cathode, such that a DDDNMOS gate formed in an HVOHORGCR device is coupled to an anode through a capacitor and is coupled to the cathode through a resistor.

7. The ESD protection device according to claim 6, further comprising: at least one diode connected in series between a terminal to which the cathode N+ diffusion region and the cathode P+ diffusion region are connected and a cathode terminal.

8. The ESD protection device according to claim 6, further comprising: a P-type MOSFET connected in series between a terminal to which the cathode N+ diffusion region and the cathode P+ diffusion region are connected and a cathode terminal.

9. An electrostatic discharge (ESD) protection device comprising:
an N-drift region formed in a semiconductor substrate;
an anode N+ diffusion region and an anode P+ diffusion region formed in the N-drift region;
a buffer N+ diffusion region formed in the N-drift region and separated a predetermined distant from the anode N+ diffusion region;
a buffer N-ballistic region surrounding the buffer N+ diffusion region;
an anode N-ballistic region surrounding the anode N+ diffusion region and the anode P+ diffusion region;
a cathode N+ diffusion region and a cathode P+ diffusion region formed in the semiconductor substrate outside the N-drift region and separated a predetermined distance from the N-drift region;
a high voltage P well surrounding the cathode N+ diffusion region and the cathode P+ diffusion region with one side of the high voltage P well disposed between the anode N-ballistic region and the buffer N-ballistic region;
a MOSFET gate disposed on the semiconductor substrate between the cathode N+ diffusion region and the N-drift region; and
a capacitor electrode disposed on the semiconductor substrate between the anode N+ diffusion region and the buffer N+ diffusion region.

10. The ESD protection device according to claim 9, further comprising: a resistor polysilicon layer on the semiconductor layer outside the high voltage P well.

11. The ESD protection device according to claim 9, wherein the buffer N-ballistic region is formed at a density of $10^{13} \sim 10^{14}$ ions/cm$^3$ to pass through the N-drift region in a depth direction.

12. The ESD protection device according to claim 9, wherein the anode N-ballistic region is formed at a density of $10^{13} \sim 10^{14}$ ions/cm$^3$ to pass through the N-drift region in a depth direction.

13. The ESD protection device according to claim 9, wherein the anode N+ diffusion region and the anode P+ diffusion region are connected together to constitute an anode, or only the anode P+ diffusion region is connected to constitute the anode without directly connecting the anode N+ diffusion region.

14. The ESD protection device according to claim 10, wherein the capacitor electrode, the MOSFET gate and the resistor polysilicon layer are connected at one end thereof to one another and the other end of the resistor polysilicon layer is connected to a cathode, such that a DDDNMOS gate formed in an HVOHORGCR device is coupled to an anode through a capacitor and is coupled to the cathode through a resistor.

15. The ESD protection device according to claim 14, further comprising: at least one diode connected in series between a terminal to which the cathode N+ diffusion region and the cathode P+ diffusion region are connected and a cathode terminal.

16. The ESD protection device according to claim 14, further comprising: a P-type MOSFET connected in series between a terminal to which the cathode N+ diffusion region and the cathode P+ diffusion region are connected and a cathode terminal.

* * * * *